United States Patent
Yu et al.

(10) Patent No.: US 11,361,986 B2
(45) Date of Patent: Jun. 14, 2022

(54) USING A LINER LAYER TO ENLARGE PROCESS WINDOW FOR A CONTACT VIA

(71) Applicant: Taiwan Semiconductor Manufacturing Co., Ltd., Hsin-Chu (TW)

(72) Inventors: Li-Zhen Yu, New Taipei (TW); Cheng-Chi Chuang, New Taipei (TW); Chih-Hao Wang, Baoshan Township (TW); Yu-Ming Lin, Hsinchu (TW); Lin-Yu Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 30 days.

(21) Appl. No.: 16/808,902

(22) Filed: Mar. 4, 2020

(65) Prior Publication Data
US 2021/0280454 A1    Sep. 9, 2021

(51) Int. Cl.
| H01L 21/768 | (2006.01) |
| H01L 23/522 | (2006.01) |
| H01L 29/66 | (2006.01) |
| H01L 29/417 | (2006.01) |

(52) U.S. Cl.
CPC .. *H01L 21/76802* (2013.01); *H01L 21/76831* (2013.01); *H01L 23/5226* (2013.01); *H01L 29/41775* (2013.01); *H01L 29/66477* (2013.01)

(58) Field of Classification Search
CPC ......... H01L 21/76897; H01L 21/76802; H01L 21/76834; H01L 21/76877; H01L 27/11582; H01L 27/11556
See application file for complete search history.

(56) References Cited

U.S. PATENT DOCUMENTS

| 9,716,158 B1 * | 7/2017 | Cheng | H01L 29/0847 |
| 2016/0365426 A1 * | 12/2016 | Ching | H01L 29/0847 |
| 2018/0315652 A1 * | 11/2018 | Tsai | H01L 21/76889 |
| 2021/0057530 A1 * | 2/2021 | Yu | H01L 21/76834 |
| 2021/0134671 A1 * | 5/2021 | Xie | H01L 21/76895 |
| 2021/0272901 A1 * | 9/2021 | Tsai | H01L 23/5283 |

* cited by examiner

*Primary Examiner* — Jaehwan Oh
*Assistant Examiner* — John M Parker
(74) *Attorney, Agent, or Firm* — Eschweiler & Potashnik, LLC

(57) ABSTRACT

In some embodiments, the present disclosure relates to an integrated chip that includes a substrate, a first contact layer, and a gate electrode. The first contact layer overlies the substrate and the gate electrode overlies the substrate and is laterally spaced from the first contact layer. A first spacer structure surrounds outermost sidewalls of the first contact layer and separates the gate electrode from the first contact layer. A first hard mask structure is arranged over the first contact layer and is between portions of the first spacer structure. A first contact via extends through the first hard mask structure and contacts the first contact layer. A first liner layer is arranged directly between the first hard mask structure and the first spacer structure.

20 Claims, 26 Drawing Sheets

200A

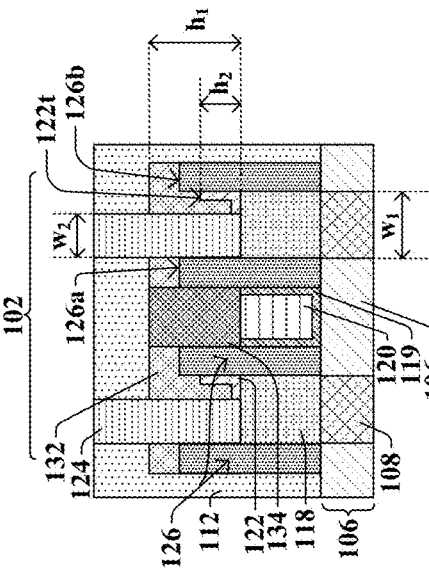
Fig. 7B
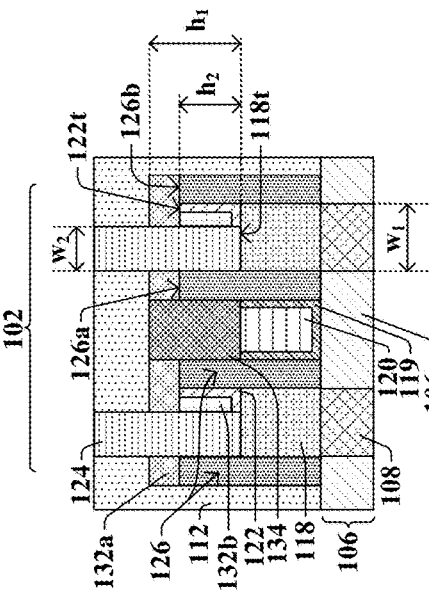
Fig. 7D
Fig. 7A
Fig. 7C

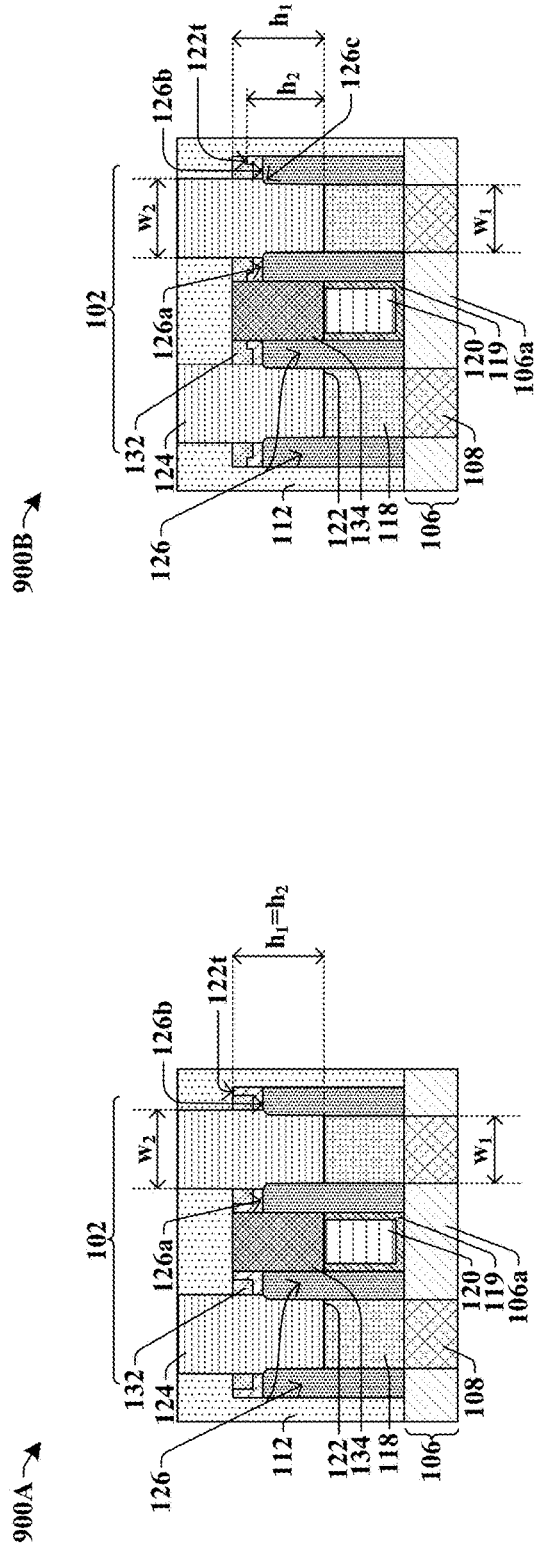
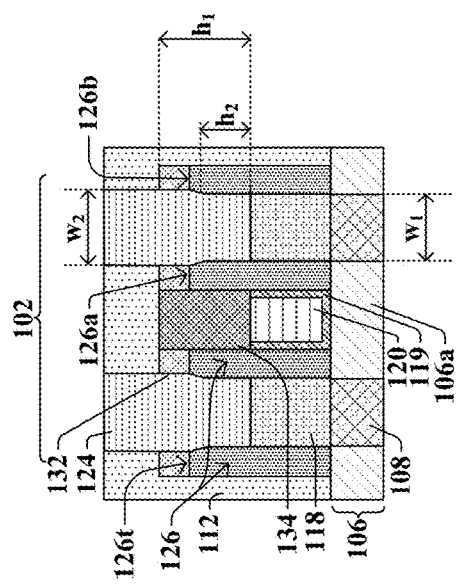
Fig. 9A  Fig. 9B  Fig. 9C

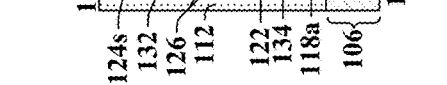
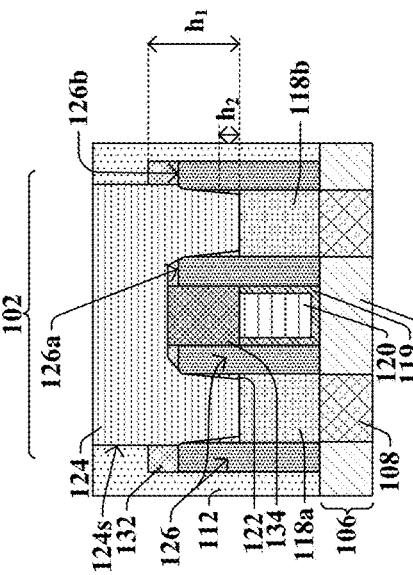
Fig. 10B
Fig. 10D
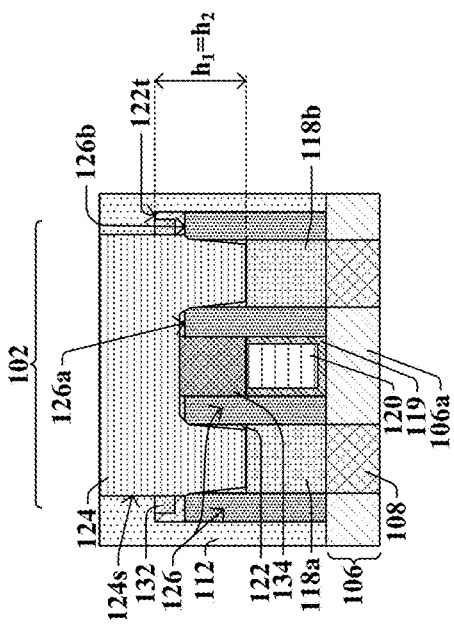
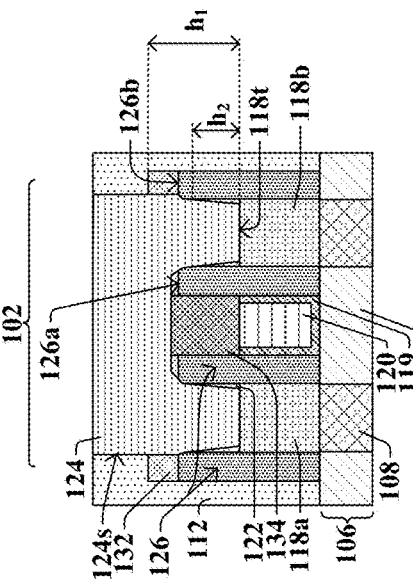
Fig. 10A
Fig. 10C

USING A LINER LAYER TO ENLARGE PROCESS WINDOW FOR A CONTACT VIA

BACKGROUND

The integrated chip manufacturing industry has experienced exponential growth over the last few decades. As integrated chips have evolved, functional density (e.g., the number of semiconductor devices per chip area) has increased while feature sizes have decreased. As feature sizes decrease, there is an increase in interference amongst the features. To mitigate interference amongst the features of the semiconductor devices, manufacturing techniques and/or features for isolation in ICs are being researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-11C illustrate cross-sectional views of some additional embodiments of an integrated chip having a transistor comprising a liner layer arranged over a contact layer.

DETAILED DESCRIPTION

Figure 1A:
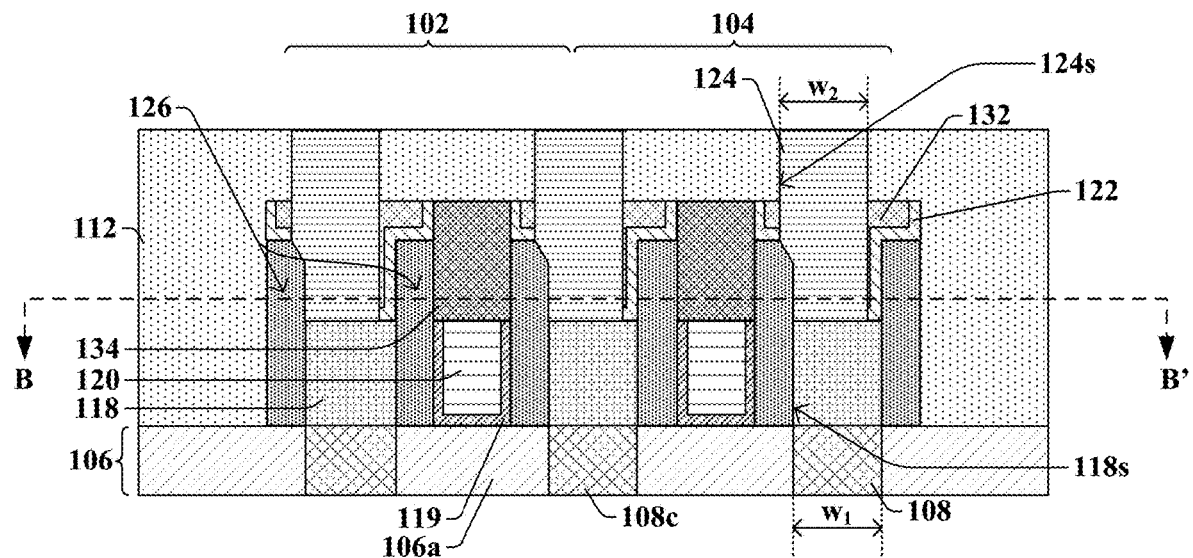
FIG. 1A-C illustrate various views of some embodiments of an integrated chip having a transistor comprising a liner layer arranged over a contact layer and a spacer structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an integrated chip comprises a transistor having a contact layer over a source/drain region of a substrate. A channel region may be arranged beside the source/drain region of the substrate, and a gate electrode may be arranged over the channel region. A contact via may be arranged over the contact layer. In some embodiments, a spacer structure isolates the gate electrode from the contact layer and the contact via.

In some embodiments, a process for forming the contact via comprises: 1) forming a hard mask structure over the contact layer, the spacer structure, and the gate electrode; 2) forming a masking structure over the hard mask structure, wherein the masking structure has a first opening that directly overlies the contact layer; 3) performing an etching process to remove the hard mask structure directly below the first opening to expose the contact layer; and 4) depositing a conductive material over the contact layer to form the contact via.

As dimensions of the features (e.g., gate electrode, contact layer, spacer structure, contact via, etc.) decrease in size, the degree of dimension and overlay control of the masking structure and first opening becomes more difficult. A process window (e.g., a resiliency) of the etching process is small at emerging process nodes. Failing to attain the high degrees of dimension and overlay control may lead to improper coupling between devices, device failure, high leakage current, or any combination of the foregoing. For example, a challenge with the aforementioned process is to prevent the first opening in the masking structure from directly overlying the spacer structure. If the spacer structure is exposed to the etching process, portions of the spacer structure may be removed by the etching process. When portions of the spacer structure are removed, isolation between the contact via and the gate electrode is poor, and interference between the contact via and the gate electrode decreases device reliability.

Various embodiments of the present disclosure are directed to the insertion of a liner layer over the spacer structures to mitigate removal of the spacer structure if exposed to the etching process. The liner layer may comprise a material that is more resistant to removal by the etching process than materials of the spacer structure. Thus, the liner layer prevents the etching process from removing the spacer structure, or reduces the amount of time the spacer structure is exposed to the etching process. Therefore, the liner layer reduces the loss of the spacer structure during the etching process to maintain reliable isolation of the gate electrode and the contact via by the spacer structure.

FIG. 1A illustrates a cross-sectional view 100A of an integrated chip comprising a liner layer overlying a contacts layer.

The integrated chip comprises a first transistor 102 and a second transistor 104 arranged over a substrate 106 and surrounded by a dielectric structure 112. In some embodiments, a source/drain region 108 is arranged on or within the substrate 106, and a channel region 106a may separate two of the source/drain regions 108 from one another. In some embodiments, the first transistor 102 and the second transistor 104 may share a shared source/drain region 108c, and thus, be coupled to one another. The first and second transistors 102, 104 may be or comprise a planar metal oxide semiconductor field effect transistor (MOSFET), a fin field effect transistor (finFET), a gate all around field effect transistor (GAAFET), or some other field effect transistor (FET), in some embodiments.

A contact layer 118 may be arranged over the source/drain region 108 and may have outermost sidewalls surrounded by a spacer structure 126. A gate electrode 120 may be arranged over the channel region 106a and laterally beside the contact layer 118. A gate isolation structure 134 may be arranged over the gate electrode 120, and the dielectric structure 112 may overlie the gate isolation structure 134. The spacer structure 126 separates the gate electrode 120 from the contact layer 118. In some embodiments, a gate dielectric layer 119 may separate the gate electrode 120 from the substrate 106. The contact layer 118 and the gate electrode 120 may both be conductive wires arranged over the substrate 106 and spaced apart by the spacer structure 126.

In some embodiments, a contact via 124 may be arranged over and coupled to the contact layer 118. The spacer structure 126 may also separate the gate electrode 120 from the contact via 124. In some embodiments, the contact via 124 may extend through the dielectric structure 112 and through a hard mask structure 132 to directly contact the contact layer 118. In some embodiments, the contact layer 118 may have a first width $w_1$, and the contact via 124 may have a second width $w_2$, wherein the second width $w_2$ is a maximum width of the contact via 124. In some embodiments, the first width $w_1$ may be about equal to or greater than the second width $w_2$. Although the contact via 124 may be formed directly over the contact layer 118 without overlying the spacer structures 126, in some embodiments, due to, for example, a small processing window during the formation of the contact via 124, the contact via 124 may not "land centered" over the contact layer 118. For example, even though the second width $w_2$ of the contact via 124 is about equal to the first width $w_1$ of the contact layer 118, an outermost sidewall 124s of the contact via 124 may directly overlie the spacer structure 126 instead of directly overlying the contact layer 118 or an outermost sidewall 118s of the contact layer 118. When the contact via 124 is formed over the spacer structure 126, the spacer structure 126 may be exposed to a first etchant used to form an opening in the hard mask structure 132 to deposit the contact via 124. In some embodiments, the first etchant may remove portions of the spacer structure 126 and threaten the function of the spacer structure 126 to isolate the contact via 124 from the gate electrode 120.

In some embodiments, a liner layer 122 may be arranged between the hard mask structure 132 and the spacer structure 126. The liner layer 122 comprises a different material than the hard mask structure 132. The liner layer 122 comprises a material that has a slower rate of removal by the first etchant than the hard mask structure 132. In some embodiments, the liner layer 122 comprises a material with a higher dielectric constant than the hard mask structure 132. Therefore, if portions of the hard mask structure 132 that directly overlie the spacer structure 126 are removed by the first etchant during the formation of the contact via 124, the liner layer 122 may reduce the amount of time that the spacer structure 126 is exposed to the first etchant, thereby reducing loss of the spacer structure 126 by the first etchant. Thus, because of the liner layer 122, in some embodiments, the spacer structure 126 may provide sufficient isolation between the contact via 124 and the gate electrode 120 even if exposed to the first etchant.

Figure 1B:
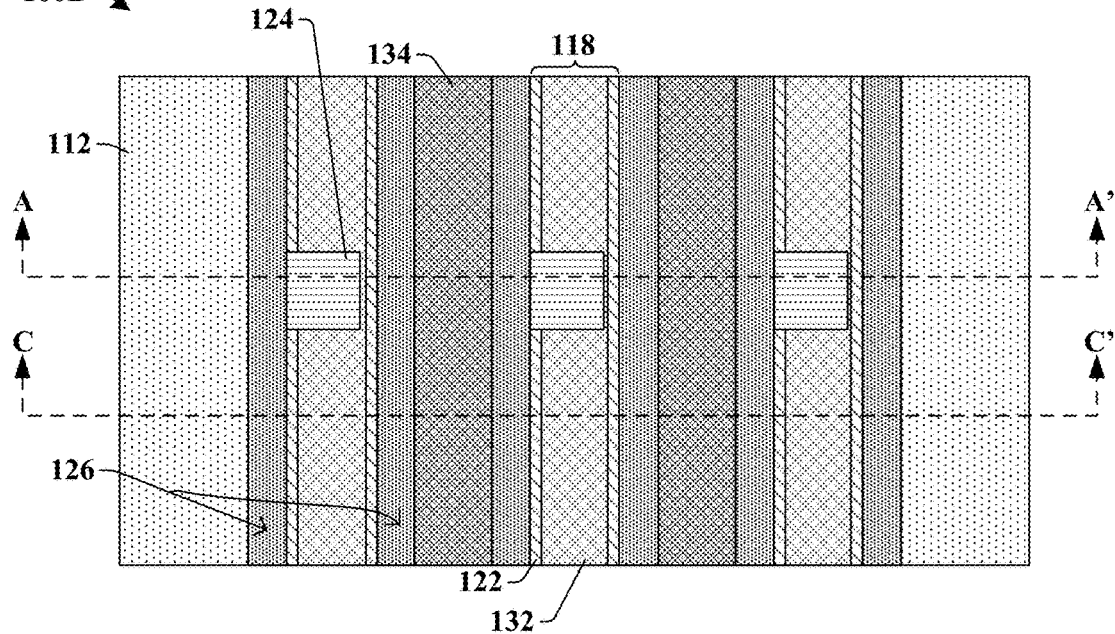

FIG. 1B illustrates a top-view 100B of some embodiments corresponding to cross-section line BB' of FIG. 1A. Cross-section line AA' of FIG. 1B may correspond to the cross-sectional view 100A of FIG. 1A.

As illustrated in the top-view 100B, in some embodiments, the contact layer 118 is arranged directly below the hard mask structure 132 and the liner layer 122, and extends in a first direction. The spacer structure 126 may also extend in the first direction and parallel to the contact layer 118. In some embodiments, from the top-view 100B, the liner layer 122 may separate the spacer structure 126 from the hard mask structure 132. In some embodiments, the contact via 124 directly overlies a portion of the contact layer 118. In some embodiments, the contact via 124 directly contacts the spacer structure 126. In other embodiments, the contact via 124 may be separated from the spacer structure 126 by the liner layer 122. In some embodiments, from the top-view 100B, the contact via 124 may resemble a polygon-like shape such as, for example, a square or rectangle. In other embodiments, from the top-view 100B, the contact via 124 may resemble other shapes such as a circle or an oval, for example.

Figure 1C:
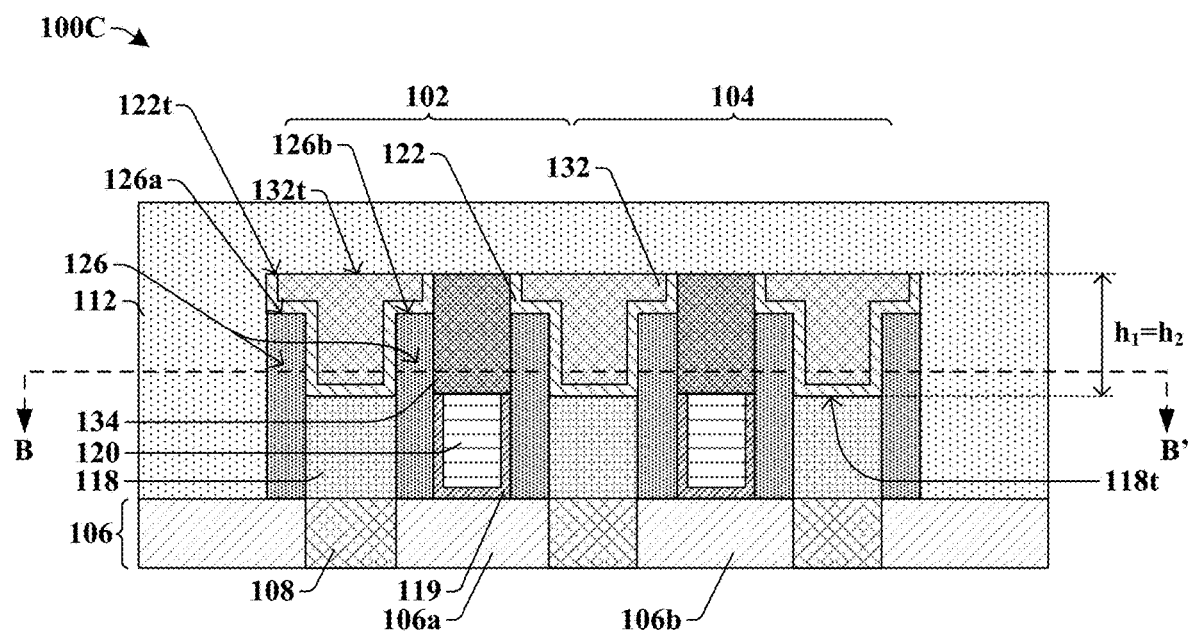

FIG. 1C illustrates a cross-sectional view 100C of some embodiments corresponding to cross-section line CC' of FIG. 1B. Cross-section line BB' of FIG. 1C may correspond to the top-view 100B of FIG. 1B.

As illustrated in the cross-sectional view 100C, the liner layer 122 also separates the hard mask structure 132 from the contact layer 118. Further, in some embodiments, from the cross-sectional view 100C, the liner layer 122 may continuously extend from a first topmost surface 126a of the spacer structure 126 to a second topmost surface 126b of the spacer structure 126, for example. In contrast, from the cross-sectional view 100A of FIG. 1A, the liner layer 122 may be discontinuous from the first topmost surface 126a of the spacer structure 126 to the second topmost surface 126b of the spacer structure 126 due to the presence of the contact via (124 of FIG. 1A).

In some embodiments, the liner layer 122 has a topmost surface 122t that is at about a same height as a topmost surface 132t of the hard mask structure 132. For example, the topmost surface 132t of the hard mask structure 132 may be at a first height $h_1$ measured from a topmost surface 118t of the contact layer 118 in a vertical direction, and the topmost surface 122t of the liner layer 122 may be at a second height $h_2$ measured from a topmost surface 118t of the contact layer 118 in the vertical direction. The vertical direction may be normal to the topmost surface 118t of the contact layer 118. In some embodiments, the first height $h_1$ equals the second height $h_2$. Further, the topmost surface 132t of the hard mask structure 132 is above the first and second topmost surfaces 126a, 126b of the spacer structure 126, and thus, in some embodiments, the liner layer 122 has a topmost surface 122t that is above the first and second topmost surfaces 126a, 126b of the spacer structure 126.

In some embodiments, the liner layer 122 may comprise, a high-k dielectric material, such as for example, a metal oxide (e.g., aluminum oxide, zirconium oxide, hafnium oxide, titanium oxide, zirconium aluminum oxide, tantalum oxide, lanthanum oxide, zinc oxide, yttrium oxide, etc.). In other embodiments, the liner layer 122 may comprise, for example, silicon oxide, hafnium silicon, silicon oxygen carbide, zirconium silicon, tantalum carbon nitride, silicon nitride, silicon oxygen carbon nitride, silicon, zirconium nitride, or silicon carbon nitride. The hard mask structure 132 and the spacer structure 126 may also comprise the aforementioned materials. In some embodiments, the liner layer 122 comprises a different material than the hard mask structure 132 and the spacer structure 126. For example, in some embodiments, the liner layer 122 comprises a high-k dielectric material, such as, for example, a metal oxide, and the hard mask structure 132 and the spacer structure 126 comprise low-k dielectric materials, such as, for example silicon nitride or silicon dioxide. Thus, because the liner layer 122 has a higher dielectric constant than the hard mask structure 132 and the spacer structure 126, the liner layer 122 may have a higher etch selectivity than the hard mask structure 132 and the spacer structure 126.

Figure 2A:
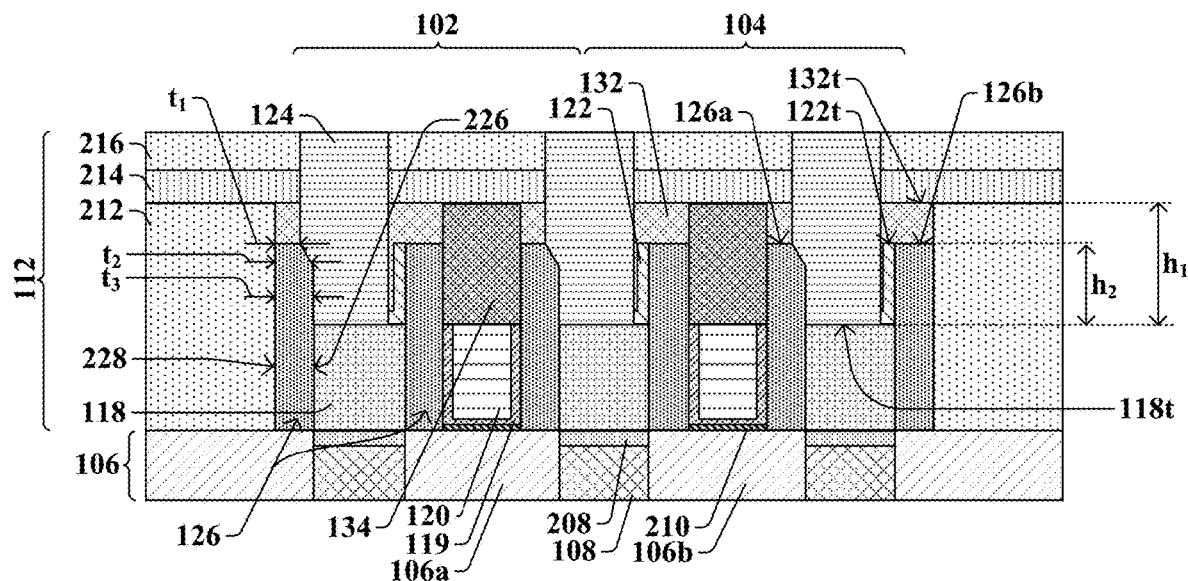
FIG. 2A illustrates a cross-sectional view of some additional embodiments of an integrated chip having a transistor comprising a liner layer arranged over a contact layer.

FIG. 2A illustrates a cross-sectional view 200A of some other embodiments of an integrated chip comprising a liner layer over a contacts layer.

In some embodiments, a silicide layer 208 is arranged over the source/drain region 108. Thus, in some embodiments, the contact layer 118 directly contacts the silicide layer 208. Further, in some embodiments, an interfacial layer 210 is arranged between the gate dielectric layer 119 and the substrate 106. In some embodiments, the dielectric structure 112 may comprise a first dielectric layer 212, an etch stop layer 214, and a second dielectric layer 216. In some embodiments, the etch stop layer 214 is arranged over and directly contacts the hard mask structure 132. In some embodiments, the etch stop layer 214 may comprise, for example, silicon oxide, hafnium silicon, silicon oxygen carbide, aluminum oxygen, zirconium silicon, aluminum oxygen nitride, zirconium oxide, tantalum oxide, lanthanum oxide, yttrium oxide, tantalum carbon nitride, silicon nitride, silicon oxygen carbon nitride, silicon, zirconium nitride, silicon carbon nitride, or the like. The first dielectric layer 212 and/or the second dielectric layer 216 may each comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like.

In some embodiments, the topmost surface 122$t$ of the liner layer 122 may be below the topmost surface 132$t$ of the hard mask structure 132. In some embodiments, the topmost surface 122$t$ of the liner layer 122 may be about even with (e.g., not above and not below) the first and second topmost surfaces 126$a$, 126$b$ of the spacer structure 126. Thus, in some embodiments, the second height $h_2$ of the liner layer 122 may be less than the first height $h_1$ of the hard mask structure 132. The second height $h_2$ of the liner layer 122 may be less than the first height $h_1$ to reduce the capacitance of the final device. However, when the first and second topmost surfaces 126$a$, 126$b$ of the spacer structure 126 are not covered by the liner layer 122, the first and second topmost surfaces 126$a$, 126$b$ of the spacer structure 126 may experience damage (e.g., increase in surface roughness, defects from ion bombardment, etc.) and more loss from a longer exposure to the first etchant than in embodiments where the liner layer 122 covers the first and second topmost surfaces 126$a$, 126$b$ of the spacer structure 126. In some embodiments, a ratio between the second height $h_2$ of the liner layer 122 to the first height $h_1$ of the hard mask structure 132 may be in a range of between, for example, approximately 10 percent and approximately 100 percent.

In some embodiments, portions of the spacer structure 126 may be removed during manufacturing of the contact via 124. Thus, in some embodiments, the spacer structure 126 may have a varying thickness between a first inner sidewall 226 and a first outer sidewall 228 throughout a height of the spacer structure 126. For example, in some embodiments, a first topmost surface 126$a$ of the spacer structure 126 may have a first thickness $t_1$, the spacer structure 126 may have a second thickness $t_2$ that is greater than the first thickness $t_1$ at a first location below the first topmost surface 126$a$ of the spacer structure 126, and the spacer structure 126 may have a third thickness $t_3$ that is greater than the second thickness $t_2$. In some embodiments, the third thickness $t_3$ may be a maximum thickness of the spacer structure 126. In some embodiments, the first thickness $t_1$ may be a minimum thickness of the spacer structure 126. The first through third thicknesses $t_{1-3}$ may each be measured from the first inner sidewall 226 to the first outer sidewall 228 in a lateral direction that is substantially perpendicular to the vertical direction. The third thickness $t_3$ may be measured at a second location that is above the topmost surface 118$t$ of the contact layer 118 and below the second location. Thus, the liner layer 122 may prevent the third thickness $t_3$ (e.g., maximum thickness) of the spacer structure 126 from being below the topmost surface 118$t$ of the contact layer 118, thereby allowing the spacer structure 126 to isolate the contact via 124 and the contact layer 118 from the gate electrode 120. If the spacer structure 126 had a reduction in thickness at a location below topmost surface 118$t$ of the contact layer 118, the spacer structure 126 may be too thin to provide sufficient isolation.

Figure 2B:
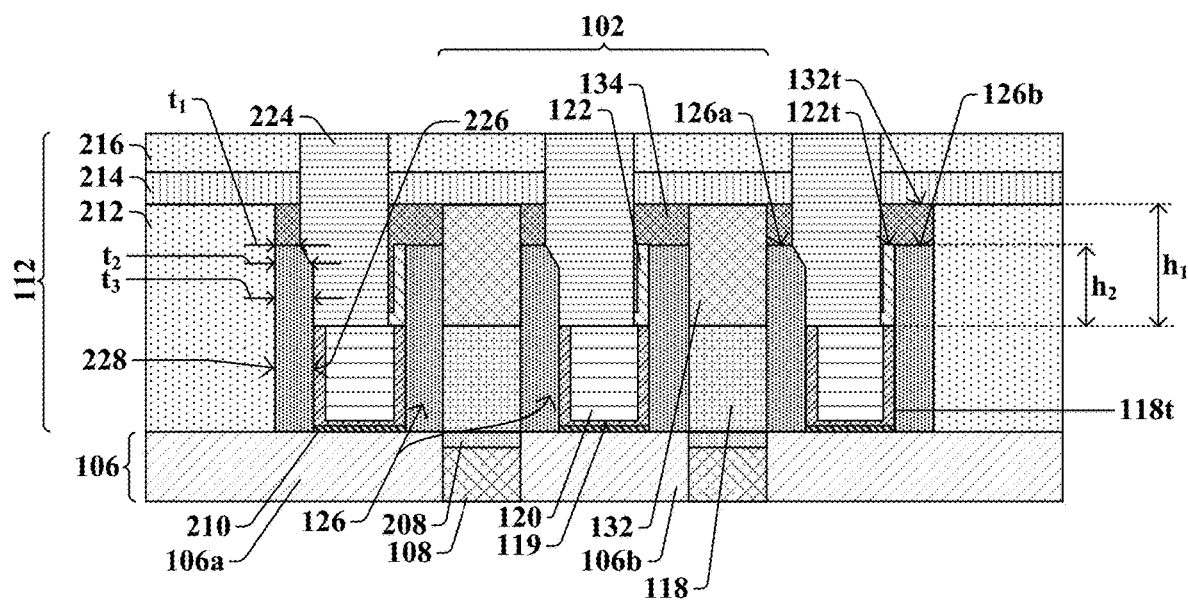
FIG. 2B illustrates a cross-sectional view of some embodiments of an integrated chip having a transistor comprising a liner layer arranged over a gate electrode.

FIG. 2B illustrates a cross-sectional view 200B of some alternative embodiments of an integrated chip comprising a liner layer beside a gate contact via, wherein the gate contact via and the liner layer are arranged over a gate electrode.

In some embodiments, from the cross-sectional view 200B, a gate contact via 224 is arranged over the gate electrode 120 and extending through the gate isolation structure 134. In such embodiments, the liner layer 122 may be arranged over the gate electrode 120 and between the gate isolation structure 134 and the gate contact via 224. It will be appreciated that the liner layer 122 and the spacer structure 126 may have the same or similar characteristics (e.g., material, thickness, etc.) as discussed in FIGS. 1A-C, 2A, and 3A-11C, except that the liner layer 122 and gate contact via 224 are arranged over the gate electrode 120 instead of the liner layer 122 and contact via (124 of FIG. 2A) being arranged over the contact layer 118. Thus, in some embodiments, the liner layer 122 directly contacts the gate electrode 120 and/or the gate dielectric layer 119. Further, in some embodiments, the liner layer 122 is arranged directly between the gate contact via 224 and the spacer structure 126. Nevertheless, in some embodiments, the liner layer 122 is arranged over the gate electrode 120 to protect the spacer structure 126 during formation of the gate contact via 224 such that the spacer structure 126 effectively isolates the gate electrode 120, the contact layer 118, and the gate contact via 224 from one another.

Figure 3A:
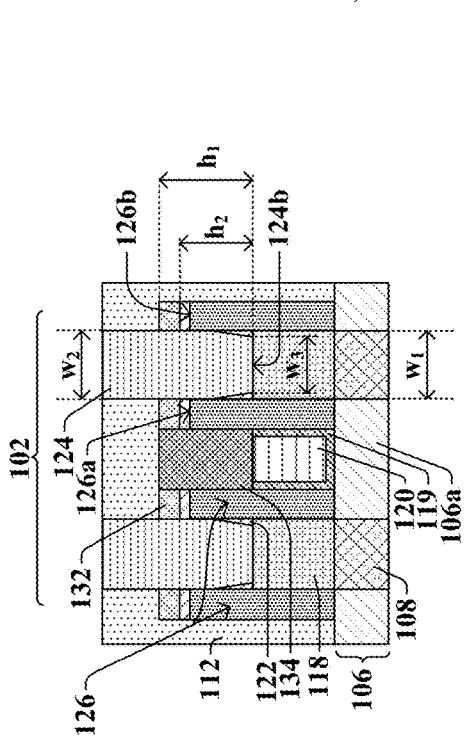
Figure 3B:
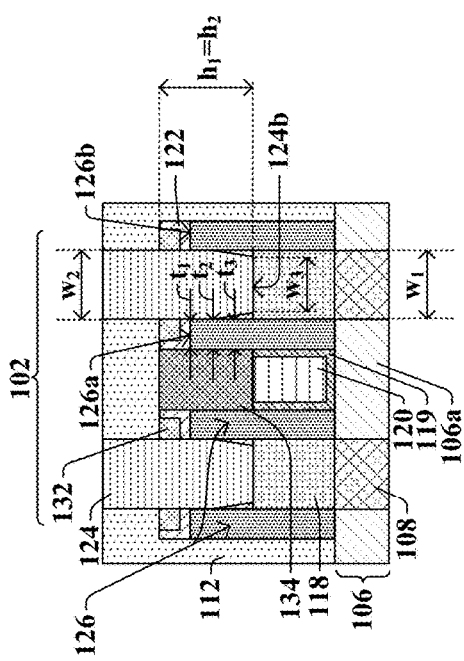
Figure 3C:
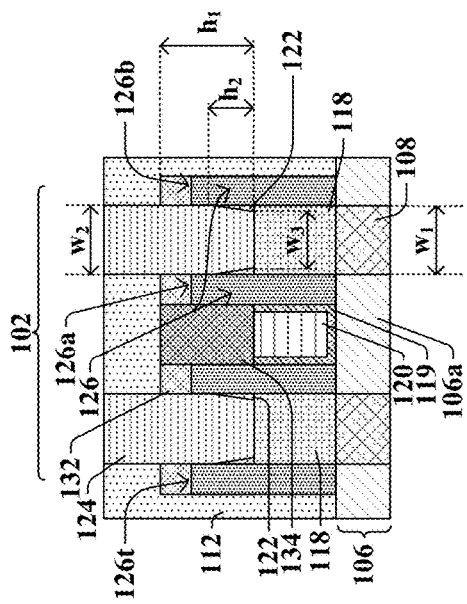

FIGS. 3A-3C illustrate cross-sectional views 300A-300C of various embodiments of an integrated chip comprising a liner layer over a contact layer, wherein the contact layer and a contact via overlying the contact layer have substantially equal widths.

In FIGS. 3A-3C, the contact via 124 is substantially centered over the contact layer 118 (e.g., the contact via 124 does not directly overlie the spacer structure 126), and the first width $w_1$ of the contact layer 118 is substantially equal to the second width $w_2$ of the contact via 124. In some embodiments, if the contact via 124 does not directly overlie the spacer structure 126, the spacer structure 126 may have a substantially uniform thickness throughout its height. For example, in some embodiments, as illustrated in the cross-sectional view 300A of FIG. 3A, the first topmost surface 126$a$ of the spacer structure 126 may have a first thickness $t_1$ that is substantially equal to the second and third thicknesses $t_2$, $t_3$ of the spacer structure 126, wherein the third thickness $t_3$ is a maximum thickness of the spacer structure 126. In some embodiments, the contact via 124 may have a bottom surface 124b that directly contacts the contact layer 118, and the bottom surface 124b may have a third width $w_3$ that is less than the first width $w_1$ of the contact layer 118. Portions of the contact via 124 may be separated from the spacer structure 126 by the liner layer 122 in some embodiments. Further, in some embodiments, portions of the contact via 124 may be directly separated from the contact layer 118 by the liner layer 122.

As illustrated in the cross-sectional view 300A of FIG. 3A, in some embodiments, the first height $h_1$ of the of the hard mask structure 132 is about equal to the second height $h_2$ of the liner layer 122. In such embodiments, the liner layer 122 may completely cover the first topmost surface 126a and the second topmost surface 126b of the spacer structure 126.

As illustrated in the cross-sectional view 300B of FIG. 3B, in some embodiments, the first height $h_1$ of the of the hard mask structure 132 is greater than the second height $h_2$ of the liner layer 122. In such embodiments, the liner layer 122 still may be arranged over and may completely cover the first topmost surface 126a and the second topmost surface 126b of the spacer structure 126.

As illustrated in the cross-sectional view 300C of FIG. 3C, in some embodiments, the first height $h_1$ of the of the hard mask structure 132 is greater than the second height $h_2$ of the liner layer 122. In such embodiments, the liner layer 122 may be arranged beneath the first topmost surface 126a and the second topmost surface 126b of the spacer structure 126, and thus, the liner layer 122 does not cover the first and second topmost surfaces 126a, 126b of the spacer structure 126. Further, in such embodiments, the liner layer 122 may separate portions of the contact via 124 from the spacer structure 126, whereas other portions of the contact via 124 may directly contact the spacer structure 126.

Figure 4A:
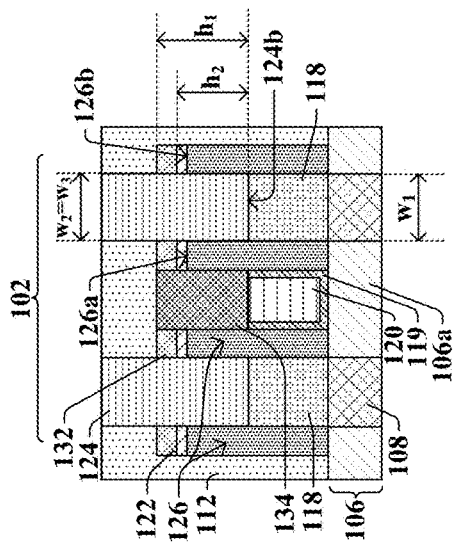
Figure 4B:
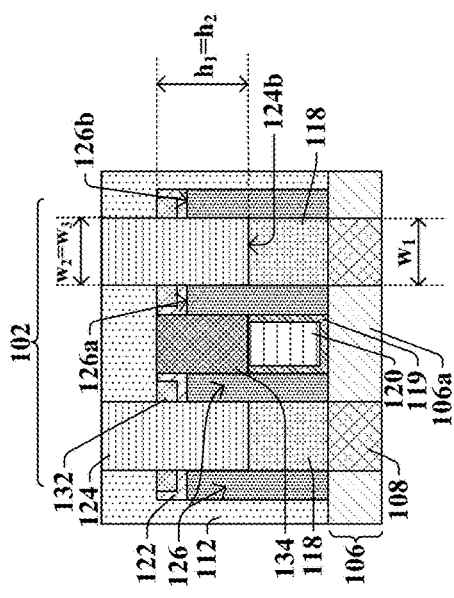
Figure 4C:
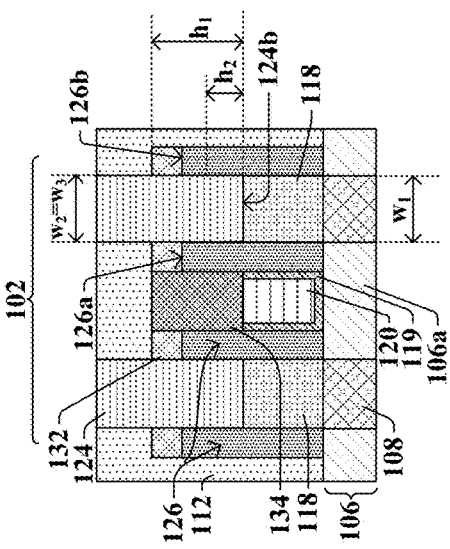

FIGS. 4A-4C illustrate cross-sectional views 400A-400C of various embodiments of an integrated chip comprising a liner layer over a contact layer, wherein the contact layer and a contact via overlying the contact layer have substantially equal widths, and wherein the liner layer is not arranged directly between the contact via and the contact layer.

In FIGS. 4A-4C, after removing the hard mask structure 132 and before depositing the contact via 124, remaining exposed portions of the liner layer 122 may be removed from the contact layer 118. Thus, after the contact via 124 is deposited/formed, the liner layer 122 is not arranged between the contact via 124 and the contact layer 118. Thus, in some embodiments, the third width $w_3$ of the contact via 124 may be substantially equal to the second width $w_2$ of the contact via 124. Advantages of removing exposed portions of the liner layer 122 include an increased contact area and thus decreased contact resistance between the contact via 124 and the contact layer 118. However, removing exposed portions of the liner layer 122 may increase the manufacturing time and/or damage the contact layer 118.

As illustrated in the cross-sectional view 400A of FIG. 4A, in some embodiments, the first height $h_1$ of the of the hard mask structure 132 is about equal to the second height $h_2$ of the liner layer 122. In such embodiments, from the cross-sectional view 400A, the liner layer 122 may be visible above the spacer structure 126.

As illustrated in the cross-sectional view 400B of FIG. 4B, in some embodiments, the first height $h_1$ of the of the hard mask structure 132 is greater than the second height $h_2$ of the liner layer 122. In such embodiments, from the cross-sectional view 400B, the liner layer 122 may be visible above the spacer structure 126.

As illustrated in the cross-sectional view 400C of FIG. 4C, in some embodiments, the first height $h_1$ of the hard mask structure 132 is greater than the second height $h_2$ of the liner layer (122 of FIG. 4B). In such embodiments, the liner layer (122 of FIG. 4B) may be arranged beneath the first topmost surface 126a and the second topmost surface 126b of the spacer structure 126, and thus, the liner layer (122 of FIG. 4B) does not cover the first and second topmost surfaces 126a, 126b of the spacer structure 126. In such embodiments, from the cross-sectional view 400C, the liner layer (122 of FIG. 4B) may not be visible. However, it will be appreciated that the liner layer (122 of FIG. 4B) would be visible from other cross-sectional view perspectives.

FIGS. 5A-5D illustrate cross-sectional views 500A-500D of various embodiments of an integrated chip comprising a liner layer over a contact layer, wherein the contact layer is wider than an overlying contact via.

In FIGS. 5A-5D, the contact via 124 is substantially centered over the contact layer 118 (e.g., the contact via 124 does not directly overlie the spacer structure 126), and the first width $w_1$ of the contact layer 118 is greater than the second width $w_2$ of the contact via 124. In some embodiments, if the contact via 124 does not directly overlie the spacer structure 126, the spacer structure 126 may have a substantially uniform thickness throughout its height. For example, in some embodiments, as illustrated in the cross-sectional view 500A of FIG. 5A, the first topmost surface 126a of the spacer structure 126 may have a first thickness $t_1$ that is substantially equal to the second and third thicknesses $t_2$, $t_3$ of the spacer structure 126, wherein the third thickness $t_3$ is a maximum thickness of the spacer structure 126. In some embodiments, the liner layer 122 directly contacts the contact layer 118, and the contact via 124 directly contacts the contact layer 118.

Figure 5A:
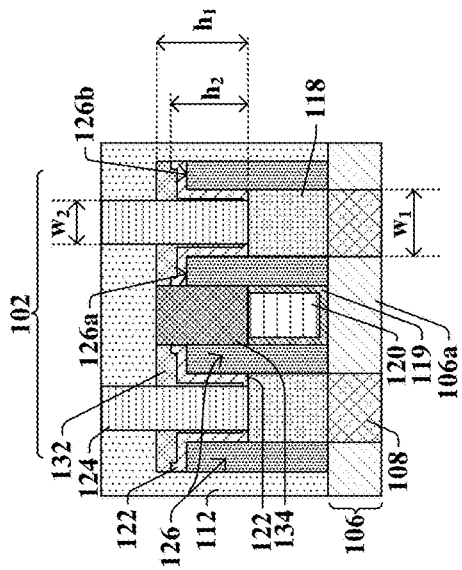

As illustrated in the cross-sectional view 500A of FIG. 5A, in some embodiments, the first height $h_1$ of the of the hard mask structure 132 is about equal to the second height $h_2$ of the liner layer 122. In such embodiments, the liner layer 122 may completely cover the first topmost surface 126a and the second topmost surface 126b of the spacer structure 126.

Figure 5B:
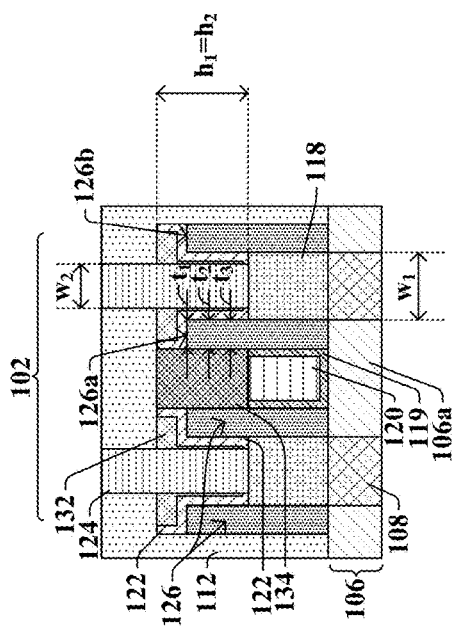

As illustrated in the cross-sectional view 500B of FIG. 5B, in some embodiments, the first height $h_1$ of the of the hard mask structure 132 is greater than the second height $h_2$ of the liner layer 122. In such embodiments, the liner layer 122 still may be arranged over and may completely cover the first topmost surface 126a and the second topmost surface 126b of the spacer structure 126.

Figure 5C:
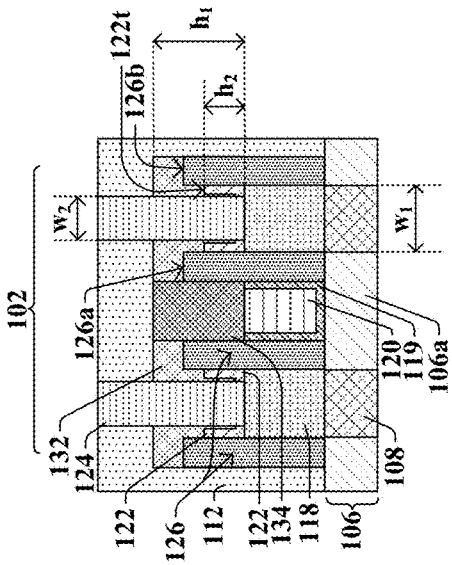

As illustrated in the cross-sectional view 500C of FIG. 5C, in some embodiments, the first height $h_1$ of the of the hard mask structure 132 is greater than the second height $h_2$ of the liner layer 122. In such embodiments, the liner layer 122 may have a topmost surface 122t that is at about a same height as the first and second topmost surfaces 126a, 126b of the spacer structure 126. For example, the topmost surface 122t of the liner layer 122 may be at a second height $h_2$ measured from a topmost surface 118t of the contact layer 118 in a vertical direction, and the first and second topmost surfaces 126a, 126b of the spacer structure may also be at the second height $h_2$ measured from a topmost surface 118t of the contact layer 118.

Figure 5D:
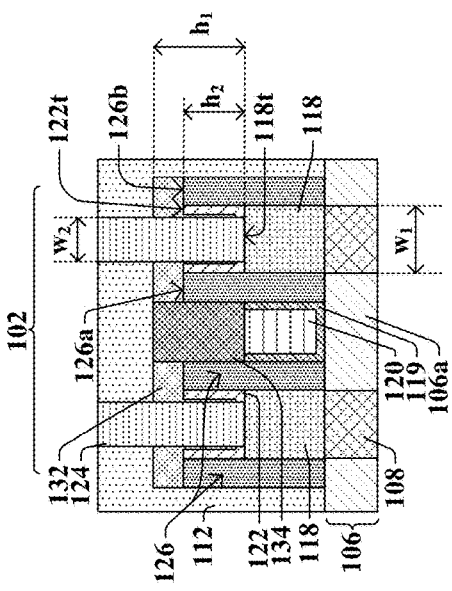

As illustrated in the cross-sectional view 500D of FIG. 5D, in some embodiments, the first height $h_1$ of the of the hard mask structure 132 is greater than the second height $h_2$ of the liner layer 122. In such embodiments, the topmost surface 122t of the liner layer 122 may be arranged beneath the first topmost surface 126a and the second topmost surface 126b of the spacer structure 126.

FIGS. 6A-6D illustrate cross-sectional views 600A-600D of some other various embodiments of an integrated chip comprising a liner layer over a contact layer, wherein the contact layer is wider than an overlying contact via.

In FIGS. 6A-6D, the first width $w_1$ of the contact layer 118 is greater than the second width $w_2$ of the contact via 124. In some embodiments, the contact via 124 may not "land centered" over the contact layer 118 during manufacturing. For example, the outermost sidewall 124s of the contact via 124 may directly overlie an outermost sidewall 118s of the contact layer 118, or in other embodiments, the outermost sidewall 124s of the contact via 124 may directly overlie the spacer structure 126. In some embodiments where the contact via 124 does not "land centered" over the contact layer 118, portions of the liner layer 122 may be arranged directly between the contact via 124 and the contact layer 118. The liner layer 122 may mitigate or prevent removal of the spacer structure 126 during the formation of the contact layer 118.

Figure 6A:
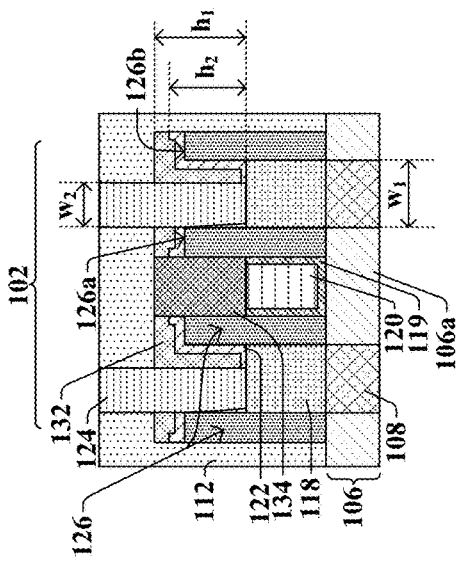

As illustrated in the cross-sectional view 600A of FIG. 6A, in some embodiments, the first height $h_1$ of the of the hard mask structure 132 is about equal to the second height $h_2$ of the liner layer 122. In such embodiments, the liner layer 122 may completely cover the first topmost surface 126a and the second topmost surface 126b of the spacer structure 126.

Figure 6B:
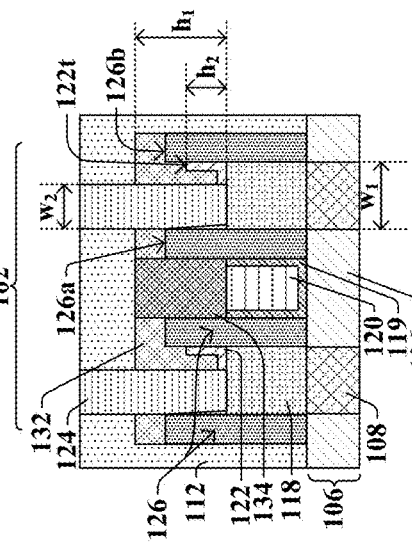

As illustrated in the cross-sectional view 600B of FIG. 6B, in some embodiments, the first height $h_1$ of the of the hard mask structure 132 is greater than the second height $h_2$ of the liner layer 122. In such embodiments, the liner layer 122 still may be arranged over and may completely cover the first topmost surface 126a and the second topmost surface 126b of the spacer structure 126.

Figure 6C:
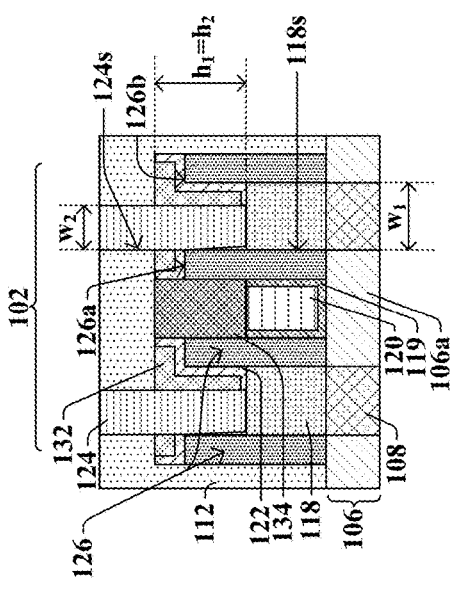

As illustrated in the cross-sectional view 600C of FIG. 6C, in some embodiments, the first height $h_1$ of the of the hard mask structure 132 is greater than the second height $h_2$ of the liner layer 122. Further, in such embodiments, the liner layer 122 may have a topmost surface 122t that is at about a same height as the first and second topmost surfaces 126a, 126b of the spacer structure 126. For example, the topmost surface 122t of the liner layer 122 may be at a second height $h_2$ measured from a topmost surface 118t of the contact layer 118 in a vertical direction, and the first and second topmost surfaces 126a, 126b of the spacer structure 126 may also be at the second height $h_2$ measured from a topmost surface 118t of the contact layer 118.

Figure 6D:
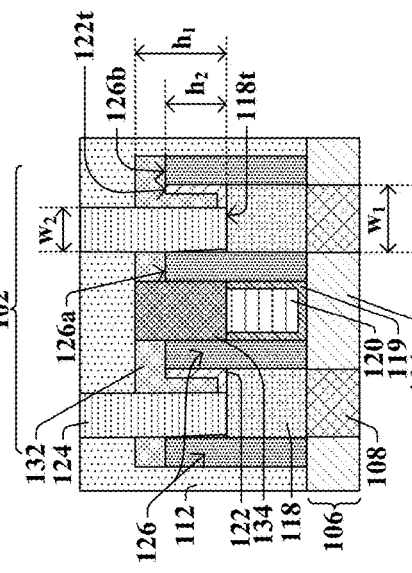

As illustrated in the cross-sectional view 600D of FIG. 6D, in some embodiments, the first height $h_1$ of the of the hard mask structure 132 is greater than the second height $h_2$ of the liner layer 122. In such embodiments, the topmost surface 122t of the liner layer 122 may be arranged beneath the first topmost surface 126a and the second topmost surface 126b of the spacer structure 126.

FIGS. 7A-7D illustrate cross-sectional views 700A-700D of yet some other various embodiments of an integrated chip comprising a liner layer over a contact layer, wherein the contact layer is wider than an overlying contact via.

In FIGS. 7A-7D, after removing the hard mask structure 132 and before depositing the contact via 124, remaining exposed portions of the liner layer 122 may be removed from the contact layer 118. Thus, after the contact via 124 is deposited/formed, the liner layer 122 is not arranged between the contact via 124 and the contact layer 118. Advantages of removing exposed portions of the liner layer 122 include an increased contact area and thus decreased contact resistance between the contact via 124 and the contact layer 118. However, removing exposed portions of the liner layer 122 may increase the manufacturing time and/or damage the contact layer 118.

As illustrated in the cross-sectional view 700A of FIG. 7A, in some embodiments, the first height $h_1$ of the of the hard mask structure 132 is about equal to the second height $h_2$ of the liner layer 122. In such embodiments, the liner layer 122 may completely cover the first topmost surface 126a and the second topmost surface 126b of the spacer structure 126.

As illustrated in the cross-sectional view 700B of FIG. 7B, in some embodiments, the first height $h_1$ of the of the hard mask structure 132 is greater than the second height $h_2$ of the liner layer 122. In such embodiments, the liner layer 122 still may be arranged over and may completely cover the first topmost surface 126a and the second topmost surface 126b of the spacer structure 126.

As illustrated in the cross-sectional view 700C of FIG. 7C, in some embodiments, the first height $h_1$ of the of the hard mask structure (132 of FIG. 7B) is greater than the second height $h_2$ of the liner layer 122. Further, in such embodiments, the liner layer 122 may have a topmost surface 122t that is at about a same height as the first and second topmost surfaces 126a, 126b of the spacer structure 126. For example, the topmost surface 122t of the liner layer 122 may be at a second height $h_2$ measured from a topmost surface 118t of the contact layer 118 in a vertical direction, and the first and second topmost surfaces 126a, 126b of the spacer structure may also be at the second height $h_2$ measured from a topmost surface 118t of the contact layer 118.

Further, in some embodiments, the hard mask structure (132 of FIG. 7B) may comprise an upper portion 132a and a lower portion 132b. In some embodiments, the upper portion 132a may have an uppermost surface at the first height $h_1$ measured from the topmost surface 118t of the contact layer 118 in the vertical direction, and the lower portion 132b may have an uppermost surface at the second height $h_2$ measured from the topmost surface 118t of the contact layer 118. In some embodiments, the upper portion 132a is wider than the lower portion 132b of the hard mask structure (132 of FIG. 7B). In some embodiments, the upper portion 132a comprises a different material than the lower portion 132b of the hard mask structure (132 of FIG. 7B), and the liner layer 122 comprises a different material than the upper and lower portions 132a, 132b of the hard mask structure (132 of FIG. 7B). The upper portion 132a and lower portion 132b of the hard mask structure (132 of FIG. 7B) may comprise different materials that have different etch selectivities. For example, in some embodiments, the upper portion 132a of the hard mask structure (132 of FIG. 7B) may have a higher etch selectivity (e.g., slower rate of removal) than the gate isolation structure 134. Further, the lower portion 132b of the hard mask structure (132 of FIG. 7B) may have a higher etch selectivity (e.g., slower rate of removal) than the spacer structure 126, for example, in some embodiments.

As illustrated in the cross-sectional view 700D of FIG. 7D, in some embodiments, the first height $h_1$ of the of the hard mask structure 132 is greater than the second height $h_2$ of the liner layer 122. In such embodiments, the topmost surface 122t of the liner layer 122 may be arranged beneath the first topmost surface 126a and the second topmost surface 126b of the spacer structure 126.

FIGS. 8A-8D illustrate cross-sectional views 800A-800D of various embodiments of an integrated chip comprising a liner layer over a contact layer, wherein the contact layer is more narrow than an overlying contact via.

In FIGS. 8A-8D, the first width $w_1$ of the contact layer 118 is less than the second width $w_2$ of the contact via 124. In some embodiments, although the contact via 124 may "land centered" over the contact layer 118 (e.g., a center of the contact via 124 directly overlies a center of the contact layer 118) during manufacturing, the contact via 124 may still directly overlie the spacer structure 126 because the contact via 124 is wider than the contact layer 118. Thus, in some embodiments, when the contact via 124 is being formed, portions of the spacer structure 126 may be removed. In some embodiments, upper inner corners 126c of the spacer structure 126 may directly contact the contact via 124. In such embodiments, an inner sidewall 126s of the spacer structure 126 may be coupled the second topmost surface 126b of the spacer structure 126 through the upper inner corner 126c. In some embodiments, the upper inner corner 126c is not a right angle, and thus, the second topmost surface 126b is not directly connected to the inner sidewall 126s of the spacer structure 126. Because of the liner layer 122, the amount of the spacer structure 126 removed during the formation of the contact via 124 is reduced.

Figure 8A:
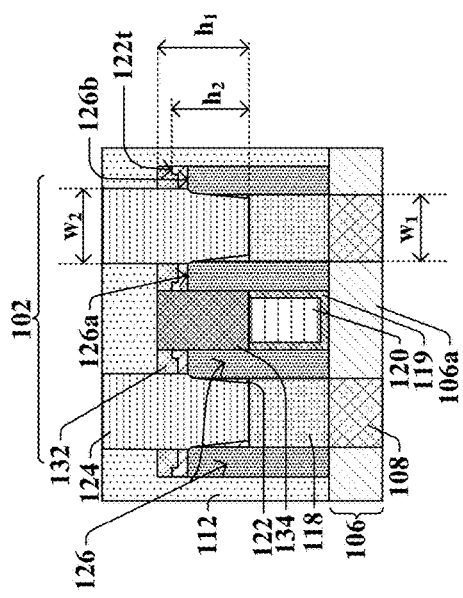

As illustrated in the cross-sectional view 800A of FIG. 8A, in some embodiments, the first height $h_1$ of the of the hard mask structure 132 is about equal to the second height $h_2$ of the liner layer 122. In such embodiments, the liner layer 122 may completely cover the first topmost surface 126a and the second topmost surface 126b of the spacer structure 126.

Figure 8B:
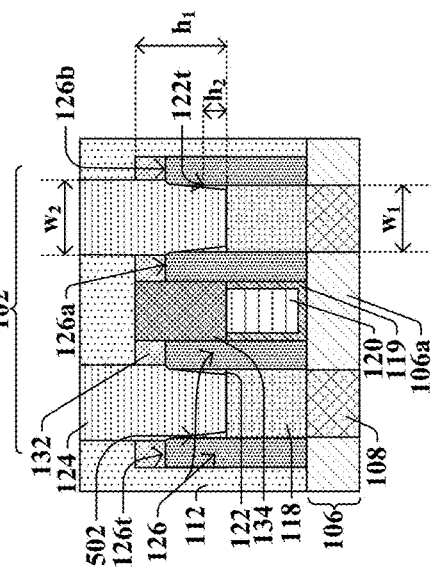

As illustrated in the cross-sectional view 800B of FIG. 8B, in some embodiments, the first height $h_1$ of the of the hard mask structure 132 is greater than the second height $h_2$ of the liner layer 122. In such embodiments, the liner layer 122 still may be arranged over and may completely cover the first topmost surface 126a and the second topmost surface 126b of the spacer structure 126.

Figure 8C:
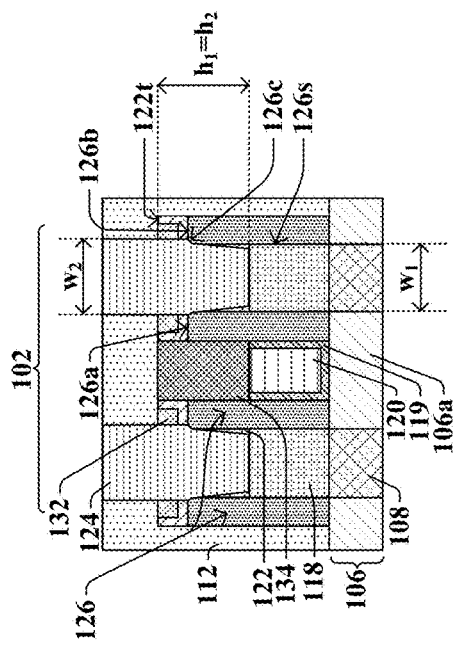

As illustrated in the cross-sectional view 800C of FIG. 8C, in some embodiments, the first height $h_1$ of the of the hard mask structure 132 is greater than the second height $h_2$ of the liner layer 122. Further, in such embodiments, the liner layer 122 may have a topmost surface 122t that is at about a same height as the first and second topmost surfaces 126a, 126b of the spacer structure 126. For example, the topmost surface 122t of the liner layer 122 may be at a second height $h_2$ measured from a topmost surface 118t of the contact layer 118 in a vertical direction, and the first and second topmost surfaces 126a, 126b of the spacer structure 126 may also be at the second height $h_2$ measured from a topmost surface 118t of the contact layer 118. In such embodiments, from the cross-sectional view 800C, the topmost surface 122t of the liner layer 122 may not be visible because it was removed during the formation of the contact via 124. However, it will be appreciated that the liner layer 122 would be visible from other cross-sectional view perspectives.

Figure 8D:
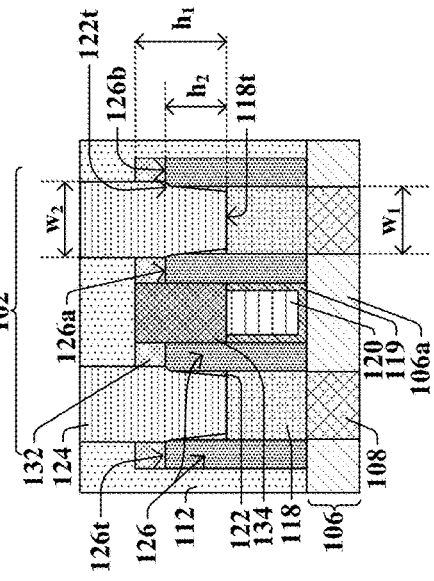

As illustrated in the cross-sectional view 800D of FIG. 8D, in some embodiments, the first height $h_1$ of the of the hard mask structure 132 is greater than the second height $h_2$ of the liner layer 122. In such embodiments, the topmost surface 122t of the liner layer 122 may be arranged beneath the first topmost surface 126a and the second topmost surface 126b of the spacer structure 126.

FIGS. 9A-9C illustrate cross-sectional views 900A-900C of various embodiments of an integrated chip comprising a liner layer over a contact layer, wherein the contact layer is more narrow than an overlying contact via.

In FIGS. 9A-9C, the first width $w_1$ of the contact layer 118 is less than the second width $w_2$ of the contact via 124. In FIGS. 9A-9C, after removing the hard mask structure 132 and before depositing the contact via 124, remaining exposed portions of the liner layer 122 may be removed from the contact layer 118. Thus, after the contact via 124 is deposited/formed, the liner layer 122 is not arranged between the contact via 124 and the contact layer 118. Advantages of removing exposed portions of the liner layer 122 include an increased contact area and thus decreased contact resistance between the contact via 124 and the contact layer 118. However, removing exposed portions of the liner layer 122 may increase the manufacturing time and/or damage the contact layer 118.

As illustrated in the cross-sectional view 900A of FIG. 9A, in some embodiments, the first height $h_1$ of the of the hard mask structure 132 is about equal to the second height $h_2$ of the liner layer 122. In such embodiments, the liner layer 122 may completely cover the first topmost surface 126a and the second topmost surface 126b of the spacer structure 126.

As illustrated in the cross-sectional view 900B of FIG. 9B, in some embodiments, the first height $h_1$ of the of the hard mask structure 132 is greater than the second height $h_2$ of the liner layer 122. In such embodiments, the liner layer 122 still may be arranged over and may completely cover the first topmost surface 126a and the second topmost surface 126b of the spacer structure 126. Further, in some embodiments, the upper inner corners 126c of the spacer structure 126 may be substantially rounded or curved.

As illustrated in the cross-sectional view 900C of FIG. 9C, in some embodiments, the first height $h_1$ of the of the hard mask structure 132 is greater than the second height $h_2$ of the liner layer (122 of FIG. 9B). In such embodiments, the liner layer (122 of FIG. 9B) may also be arranged beneath the first topmost surface 126a and the second topmost surface 126b of the spacer structure 126, and thus, the liner layer (122 of FIG. 9B) does not cover the first and second topmost surfaces 126a, 126b of the spacer structure 126. In such embodiments, from the cross-sectional view 900C, the liner layer (122 of FIG. 9B) may not be visible. However, it will be appreciated that the liner layer (122 of FIG. 9B) would be visible from other cross-sectional view perspectives.

FIGS. 10A-10D illustrate cross-sectional views 1000A-1000D of various embodiments of an integrated chip comprising a contact via and liner layer over a first contact layer and a second contact layer.

In FIGS. 10A-10D, a contact via 124 continuously extends over a first contact layer 118a and a second contact layer 118b in some embodiments. In such embodiments, outermost sidewalls 124s of the contact via 124 may directly overlie the spacer structure. Thus, FIGS. 10A-10D may comprise same or similar features as FIGS. 8A-8D, respectively, in some embodiments, except that in FIGS. 10A-10D, a contact via 124 continuously extends from the first contact layer 118a, over the gate electrode 120, and to the second contact layer 118b. In some embodiments, the gate isolation structure 134 separates the gate electrode 120 from the contact via 124.

Figure 11A:
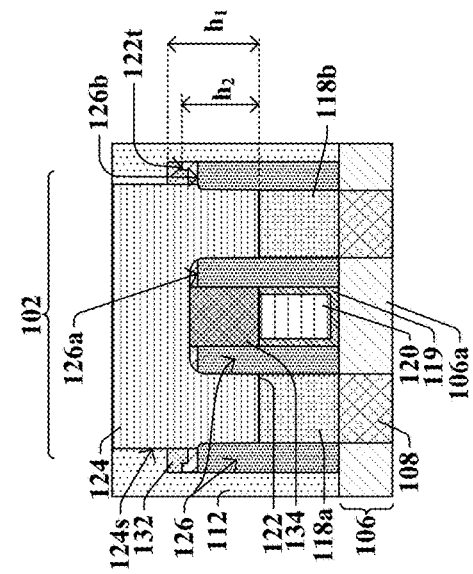
Figure 11B:
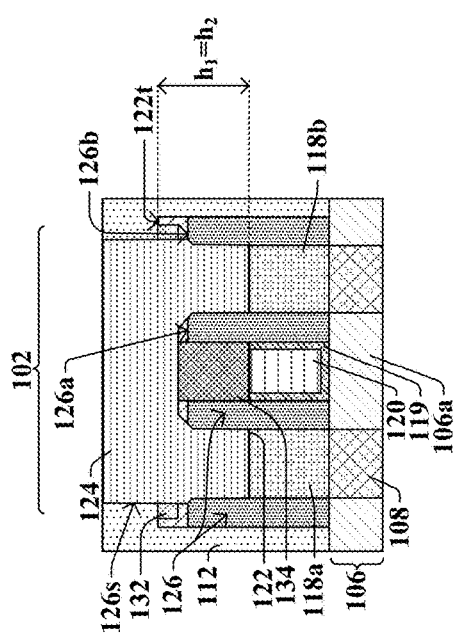
Figure 11C:
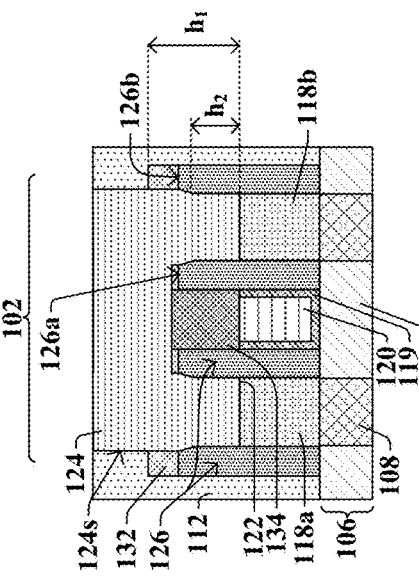

FIGS. 11A-11C illustrate cross-sectional views 1100A-1100C of various embodiments of an integrated chip comprising a contact via and liner layer over a first contact layer and a second contact layer.

Like FIGS. 10A-10D, in FIGS. 11A-11C, a contact via 124 continuously extends over a first contact layer 118a and a second contact layer 118b in some embodiments. In such embodiments, outermost sidewalls 124s of the contact via 124 may directly overlie the spacer structure. Further, in FIGS. 11A-11C, after removing the hard mask structure 132 and before depositing the contact via 124, remaining exposed portions of the liner layer 122 may be removed from the first and second contact layers 118a, 118b. Thus, after the contact via 124 is deposited/formed, the liner layer 122 is not arranged between the contact via 124 and the first or second contact layers 118a, 118b. Thus, FIGS. 11A-11C may comprise same or similar features as FIGS. 9A-9C, respectively, in some embodiments, except that in FIGS. 11A-11C, a contact via 124 continuously extends from the first contact layer 118a, over the gate electrode 120, and to the second contact layer 118b. In some embodiments, the gate isolation structure 134 separates the gate electrode 120 from the contact via 124.

FIGS. 12-33 illustrate various views 1200-3300 of some embodiments of a method of forming a liner layer over a spacer structure surrounding a contact layer in order to reduce losses of the spacer structure during removal processes. Although FIGS. 12-33 are described in relation to a method, it will be appreciated that the structures disclosed in FIGS. 12-33 are not limited to such a method, but instead may stand alone as structures independent of the method.

Figure 12:
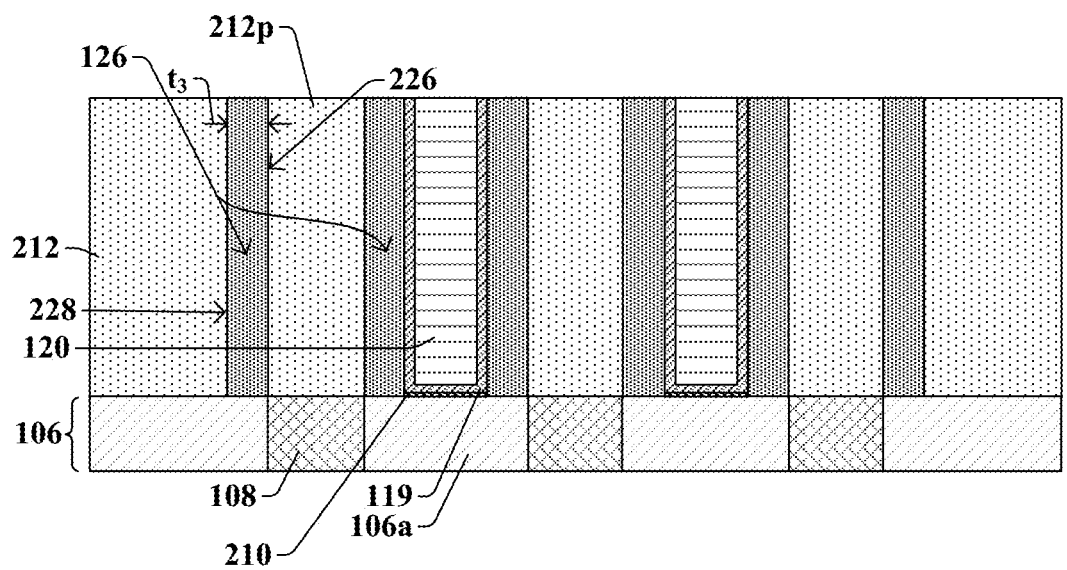
FIGS. 12-33 illustrate various views of some embodiments of a method of forming an integrated chip having a transistor comprising a liner layer arranged over a spacer structure and a contact layer to protect spacer structure from removal processes.

As shown in cross-sectional view 1200 of FIG. 12, a substrate 106 comprising a channel region 106a laterally beside a source/drain region 108 may be provided. The substrate 106 may comprise a semiconductor material, such as silicon or germanium, for example. In some embodiments, the source/drain region 108 is formed by removing portions of the substrate 106, and epitaxially growing the source/drain region 108 on the substrate 106. In other embodiments, the source/drain region 108 may be formed by selectively doping the substrate 106. The source/drain region 108 has a different doping type than the channel region 106a. Further, a gate electrode 120 may be formed over the channel region 106a within a first dielectric layer 212 arranged over the substrate 106. The gate electrode 120 may have lower and sidewall surfaces surrounded by a gate dielectric layer 119. In some embodiments, the gate dielectric layer 119 may comprise a high-k dielectric material such as, for example, hafnium oxide, zirconium oxide, or the like. Further, in some embodiments, an interfacial layer 210 may be arranged directly between the substrate 106 and the gate electrode 120. In some embodiments, the interfacial layer 210 may comprise silicon dioxide, for example. The gate electrode 120 may comprise a conductive material such as, for example, polysilicon, aluminum, ruthenium, palladium, or some other conductive metal.

A portion 212p of the first dielectric layer 212 may be surrounded by a spacer structure 126. The spacer structure 126 may separate the portion 212p of the first dielectric layer 212 from the gate electrode 120. The portion 212p of the first dielectric layer 212 may directly overlie the source/drain region 108. In some embodiments, the first dielectric layer 212 comprises, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. Further, in some embodiments, the spacer structure 126 comprises, for example, a low-k dielectric material, such as, silicon oxygen carbide, zirconium silicon, tantalum carbon nitride, silicon nitride, silicon oxygen carbon nitride, silicon, zirconium nitride, or silicon carbon nitride. The spacer structure 126 may have a third thickness $t_3$ measured from a first inner sidewall 226 to a first outer sidewall 228 in a lateral direction. In some embodiments, the third thickness $t_3$ is in a range of between, for example, approximately 1 nanometer and approximately 40 nanometers.

Figure 13:
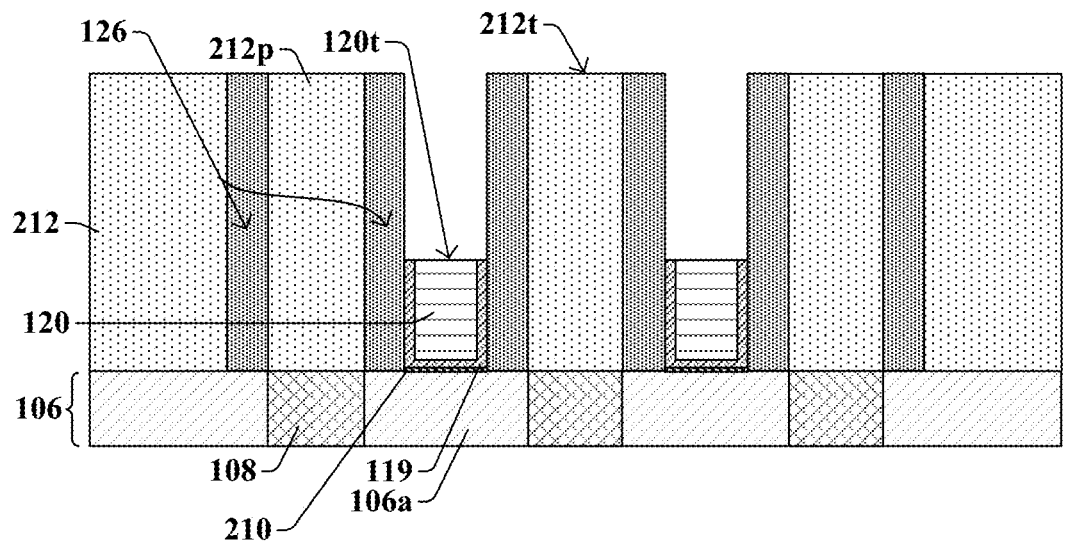

As shown in cross-sectional view 1300 of FIG. 13, in some embodiments, a gate electrode etchback process may be performed to reduce the height of the gate electrode 120, such that a topmost surface 120t of the gate electrode 120 is arranged below a topmost surface 212t of the first dielectric layer 212. In some embodiments, the gate electrode etchback process may be conducted by way of photolithography and removal (e.g., etching) processes, for example. In some embodiments, the gate electrode etchback process may also reduce the height of the gate dielectric layer 119, whereas in other embodiments (not shown), the gate dielectric layer 119 may remain substantially unchanged during the gate electrode etchback process. The spacer structure 126 and the first dielectric layer 212 may remain substantially unchanged during the gate electrode etchback process.

Figure 14:
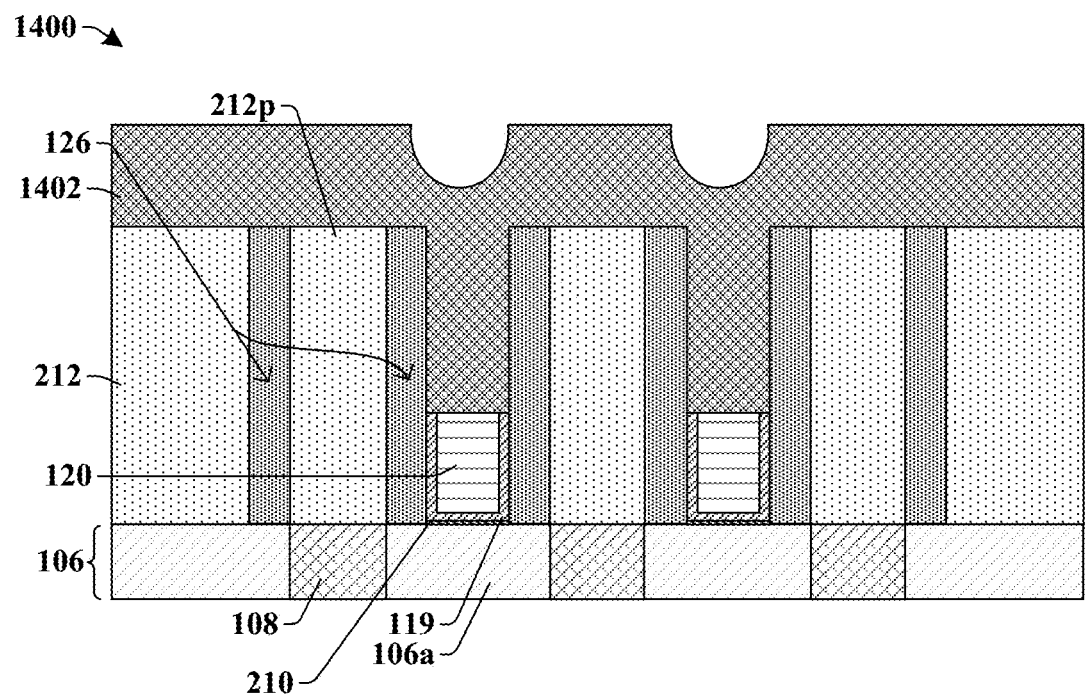

As shown in cross-sectional view 1400 of FIG. 14, a first isolation material 1402 may be deposited over the gate electrode 120. In some embodiments, the first isolation material 1402 may also be arranged over the first dielectric layer 212 and the spacer structure 126. In some embodiments, the first isolation material 1402 may comprise, a low-k dielectric material, such as, for example, silicon oxide, silicon oxygen carbide, zirconium silicon, tantalum carbon nitride, silicon nitride, silicon oxygen carbon nitride, silicon, zirconium nitride, or silicon carbon nitride. In some embodiments, the first isolation material 1402 may be deposited by way of a deposition process (e.g., chemical vapor deposition (CVD), physical vapor deposition (PVD), atomic layer deposition (ALD), etc.).

Figure 15:
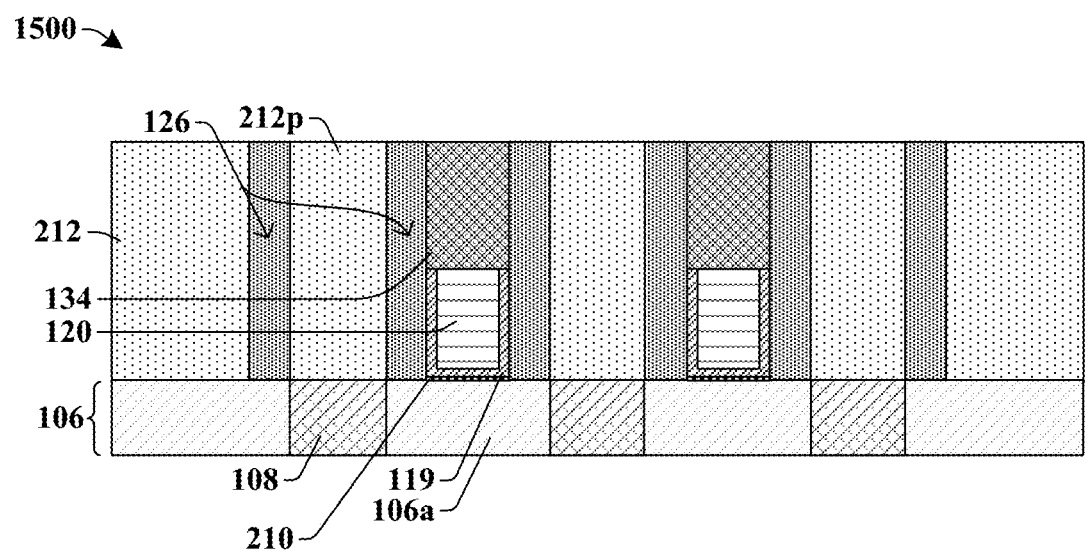

As shown in cross-sectional view 1500 of FIG. 15, a planarization process (e.g., chemical mechanical planarization (CMP)) may be performed to remove portions of the first isolation material (1402 of FIG. 14) that overlie the first dielectric layer 212 to form a gate isolation structure 134 over the gate electrode 120. The planarization process may also remove portions of the spacer structure 126 and the first dielectric layer 212, in some embodiments. After the planarization process, the gate isolation structure 134, the spacer structure 126 and the first dielectric layer 212 may have substantially co-planar upper surfaces.

Figure 16:
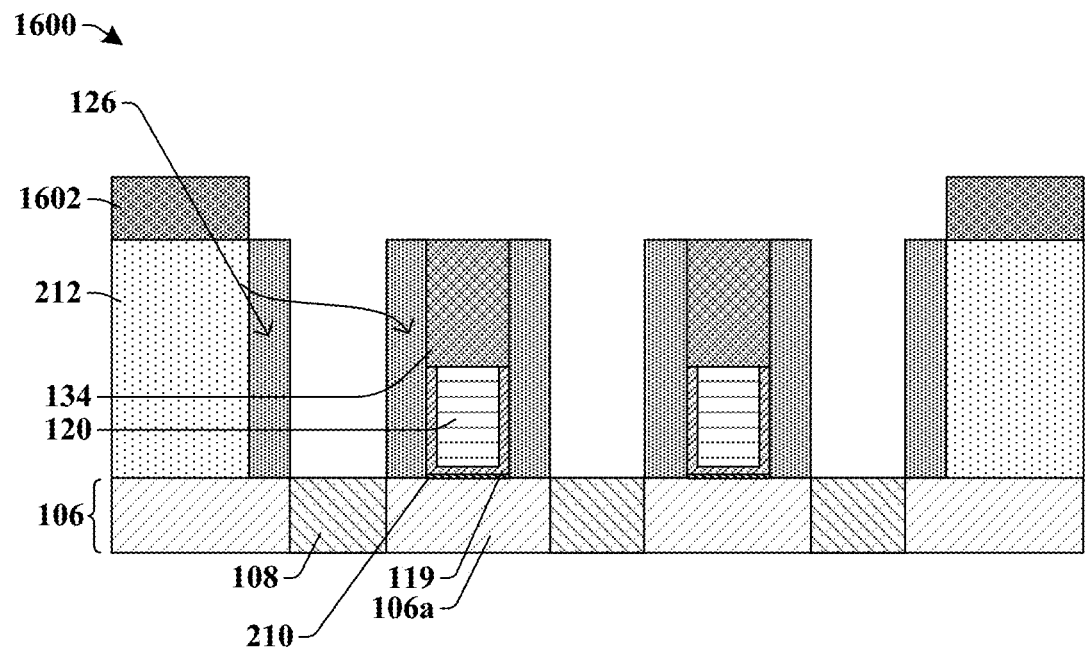

As shown in cross-sectional view 1600 of FIG. 16, the portion (212p of FIG. 15) of the first dielectric layer 212 may be removed to expose the source/drain region 108. In some embodiments, a first masking structure 1602 may be formed over the first dielectric layer 212 before removing the portion (212p of FIG. 15) of the first dielectric layer 212. The first masking structure 1602 may be formed through photolithography and removal (e.g., etching) processes. In some embodiments, the first masking structure 1602 is a hard mask. The first masking structure 1602 may protect other portions of the first dielectric layer 212 that do not directly overlie the source/drain region 108. In some embodiments, the portion (212p of FIG. 15) of the first dielectric layer 212 may be removed by an etching (e.g., wet etch, dry etch) process, and the spacer structure 126 and/or gate isolation structure 134 may remain substantially unchanged during the removal of the portion (212p of FIG. 15) of the first dielectric layer 212.

Figure 17:
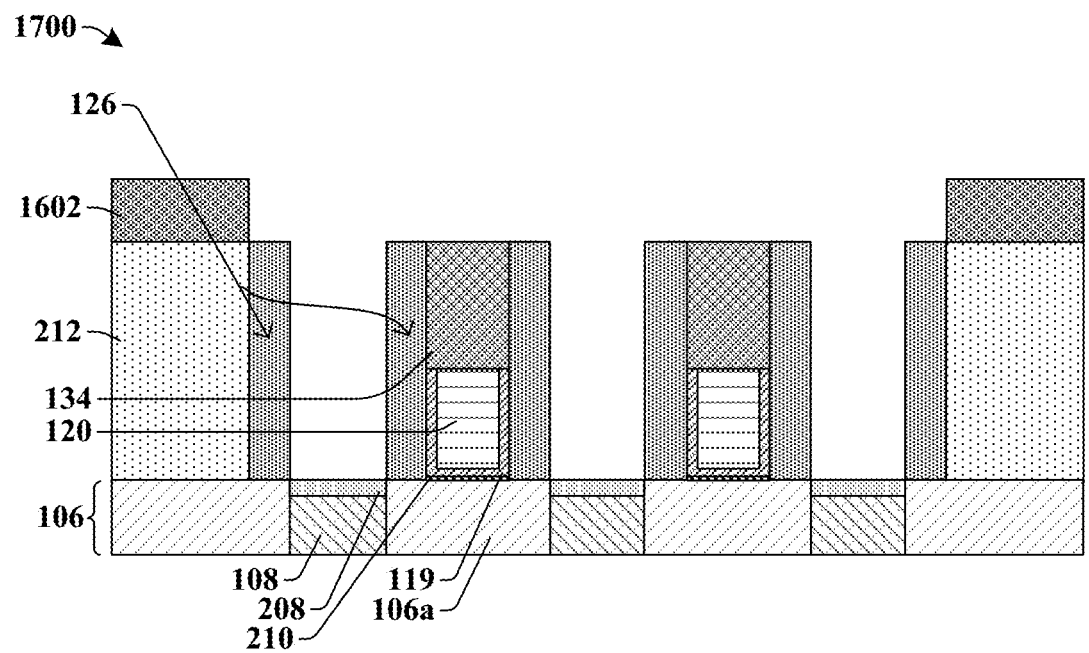

As shown in cross-sectional view 1700 of FIG. 17, a silicide layer 208 may be formed over the source/drain region 108 in some embodiments. The silicide layer 208 may be formed, in some embodiments, by way of depositing a transition metal layer over the source/drain region 108 and heating the transition metal layer so it reacts with the exposed source/drain region 108 to form the silicide layer 208. Further, in some embodiments, the process also comprises removing unreacted material of the transition metal layer by an etch.

Figure 18:
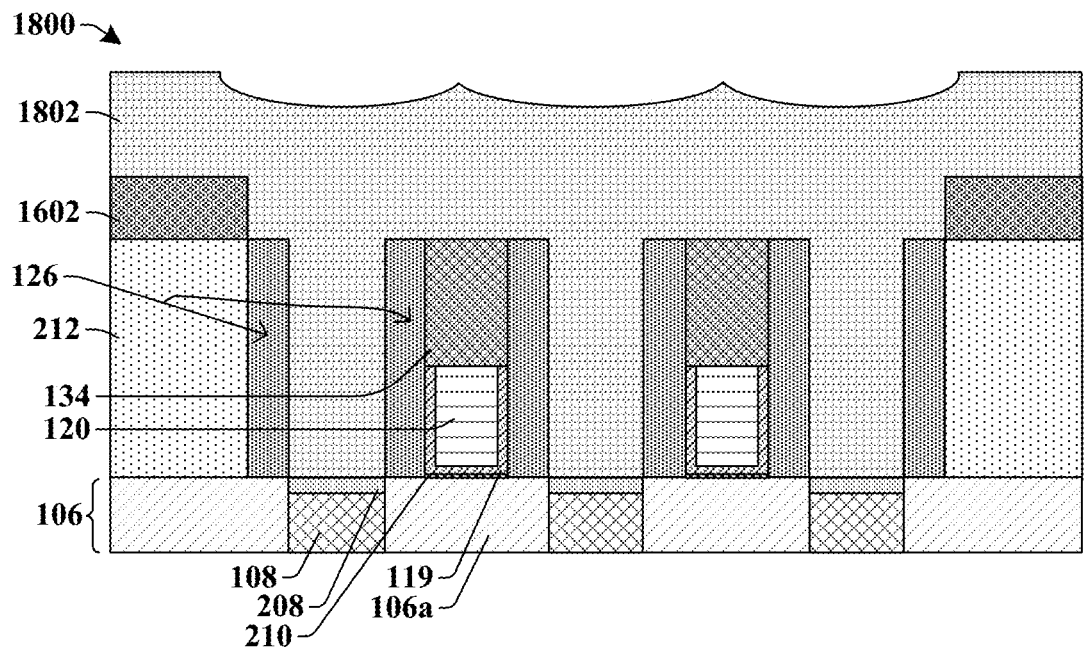

As shown in cross-sectional view 1800 of FIG. 18, a first conductive material 1802 is deposited over the substrate 106. In some embodiments, the first conductive material 1802 may be deposited by way of a deposition process (e.g., physical vapor deposition (PVD), chemical vapor deposition (CVD), PE-CVD, atomic layer deposition (ALD), sputtering, etc.). In some embodiments, the first conductive material 1802 may comprise, for example, tungsten, ruthenium, cobalt, copper, titanium, titanium nitride, tantalum, tantalum nitride, molybdenum, nickel, or a combination thereof.

Figure 19:
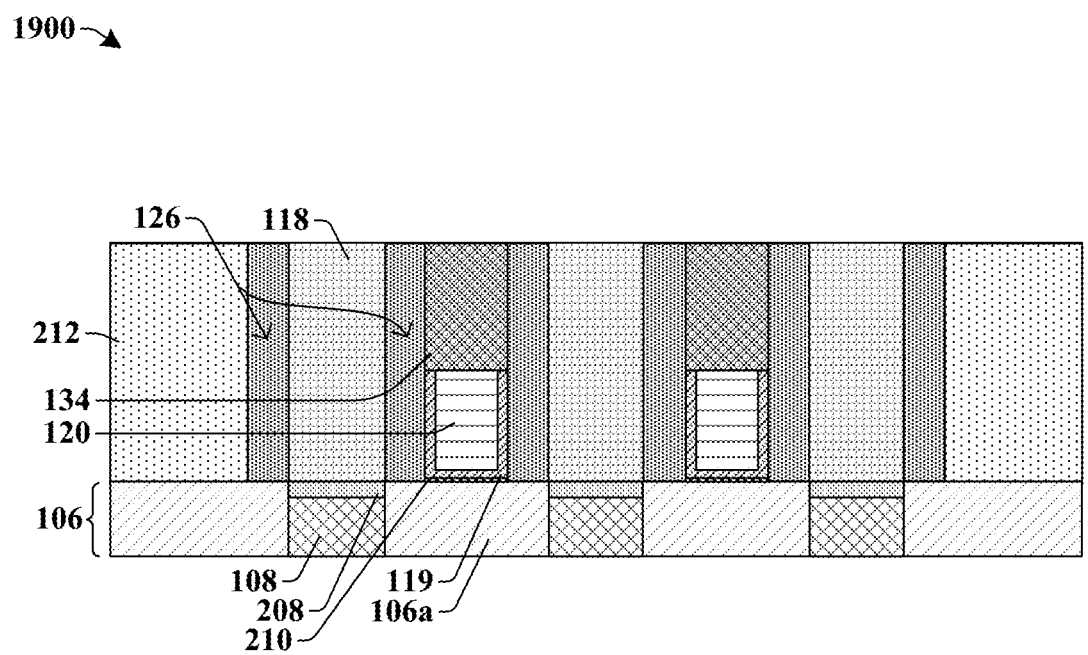

As shown in cross-sectional view 1900 of FIG. 19, upper portions of the first conductive material (1802 of FIG. 18) that overlie the first dielectric layer 212 may be removed to form a contact layer 118 arranged over the silicide layer 208. In some embodiments, the upper portions of the first conductive material (1802 of FIG. 18) may be removed by a planarization process (e.g., CMP). In such embodiments, after the planarization process (e.g., CMP), the gate isolation structure 134, the spacer structure 126, the first dielectric layer 212, and the contact layer 118 may have substantially co-planar upper surfaces. In some embodiments, the first masking structure (1602 of FIG. 16) may be removed by the planarization process.

As shown in cross-sectional view 2000A of FIG. 20A, in some embodiments, a contact layer etchback may be performed to reduce the height of the contact layer 118, such that a topmost surface 118t of the contact layer 118 is arranged below a first topmost surface 126a and a second topmost surface 126b of the spacer structure 126. In some embodiments, the contact layer etchback may be conducted using a removal (e.g., etching) process that selectively removes the first conductive material (1802 of FIG. 18) of the contact layer 118. In some embodiments, the contact layer etchback may also remove portions of the spacer structure 126, first dielectric layer 212, and/or gate isolation structure 134. For example, in the cross-sectional view 2000A, after the contact layer etchback, the first and second topmost surfaces 126a, 126b of the spacer structure 126 are below a topmost surface 212t of the first dielectric layer 212.

In some embodiments, the contact layer 118 may have a first width $w_1$ measured in the lateral direction between outermost sidewalls of the contact layer 118. In some embodiments, the first width $w_1$ is in a range of between, for example, approximately 1 nanometer and approximately 50 nanometers.

Figure 20A:
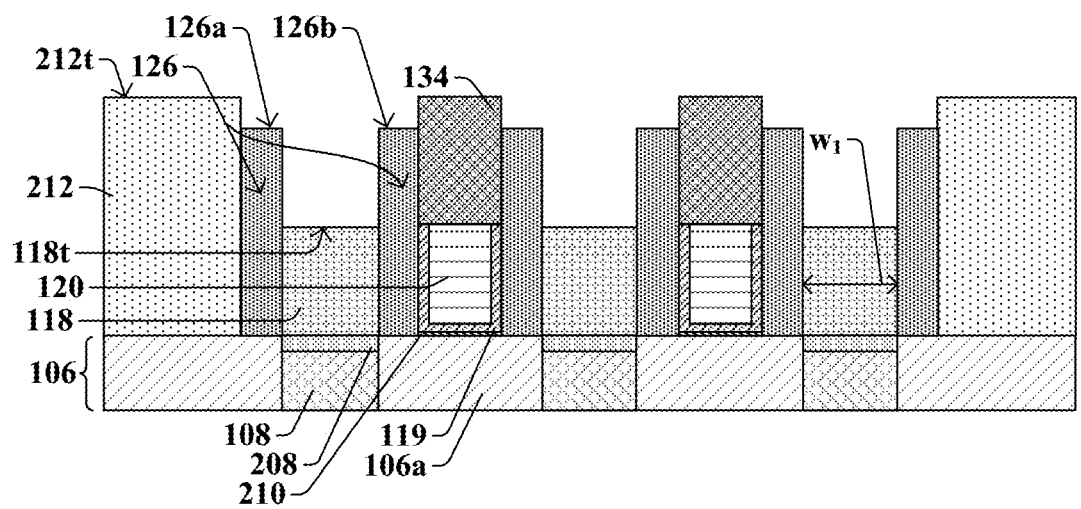
Figure 20B:
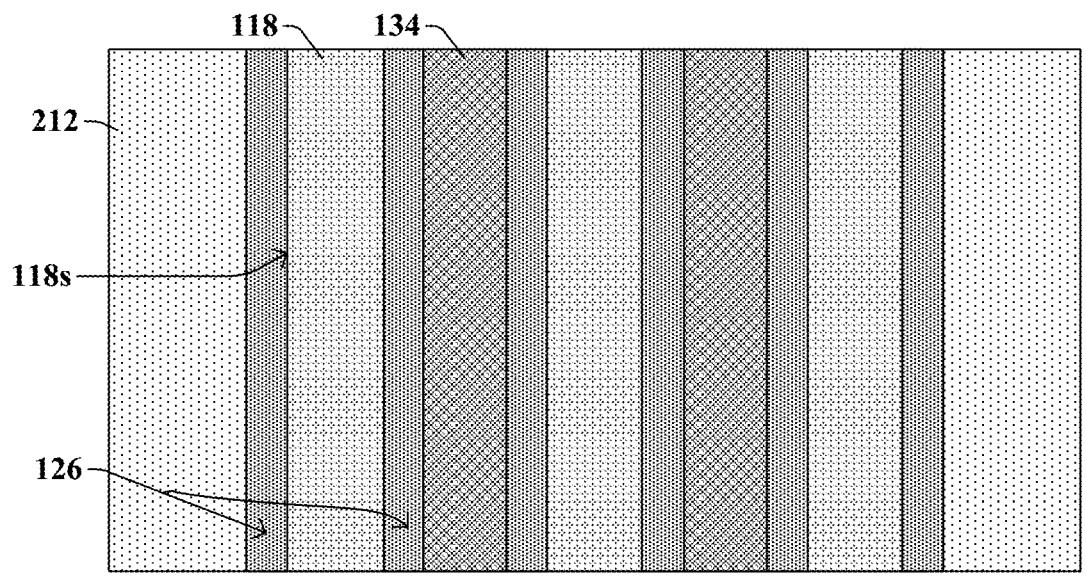

Top-view 2000B of FIG. 20B may correspond to the cross-sectional view 2000A of FIG. 20A, in some embodiments. In some embodiments, the contact layer 118 may extend in a first direction, and the spacer structure 126 may extend in the first direction substantially parallel to the contact layer 118. From the top-view 2000B, the spacer structure 126 continuously surrounds outermost sidewalls 118s of the contact layer 118.

Figure 21:
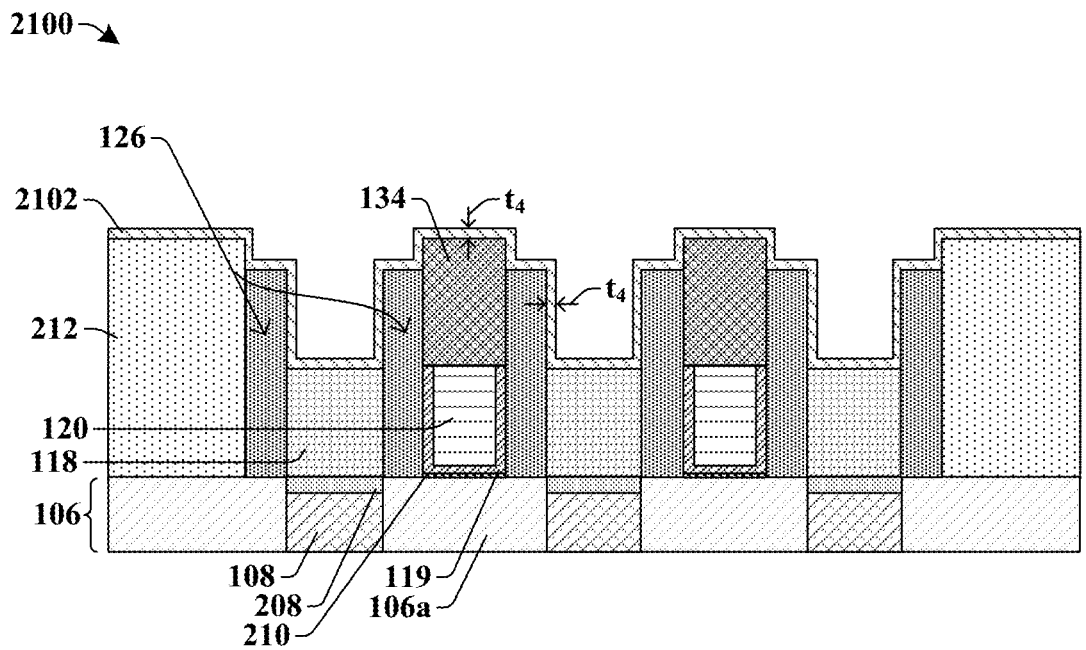

As shown in cross-sectional view 2100 of FIG. 21, a continuous liner layer 2102 may be formed over the first dielectric layer 212, the spacer structure 126, and the contact layer 118. In some embodiments, the continuous liner layer 2102 may comprise, a high-k dielectric material, such as, for example, aluminum oxide, zirconium oxide, hafnium oxide, titanium oxide, zirconium aluminum oxide, zinc oxide, tantalum oxide, lanthanum oxide, or yttrium oxide. The continuous liner layer 2102 comprises a different material than the spacer structure 126, and may comprise a material with a higher dielectric constant than the spacer structure 126. Further, in some embodiments, the continuous liner layer 2102 may have a fourth thickness $t_4$ in a range of between, for example, approximately 1 nanometer and approximately 10 nanometers. In some embodiments, the continuous liner layer 2102 may be formed by way of a deposition process, such as, for example, atomic layer deposition (ALD). In other embodiments, the continuous liner layer 2102 may be formed by way of other deposition processes such as chemical vapor deposition (CVD) or physical vapor deposition (PVD), for example.

In some embodiments, the method proceeds from FIG. 21 to FIG. 26, thereby skipping the steps illustrated in FIGS. 22-25. In other embodiments, the method proceeds to FIG. 22.

Figure 22:
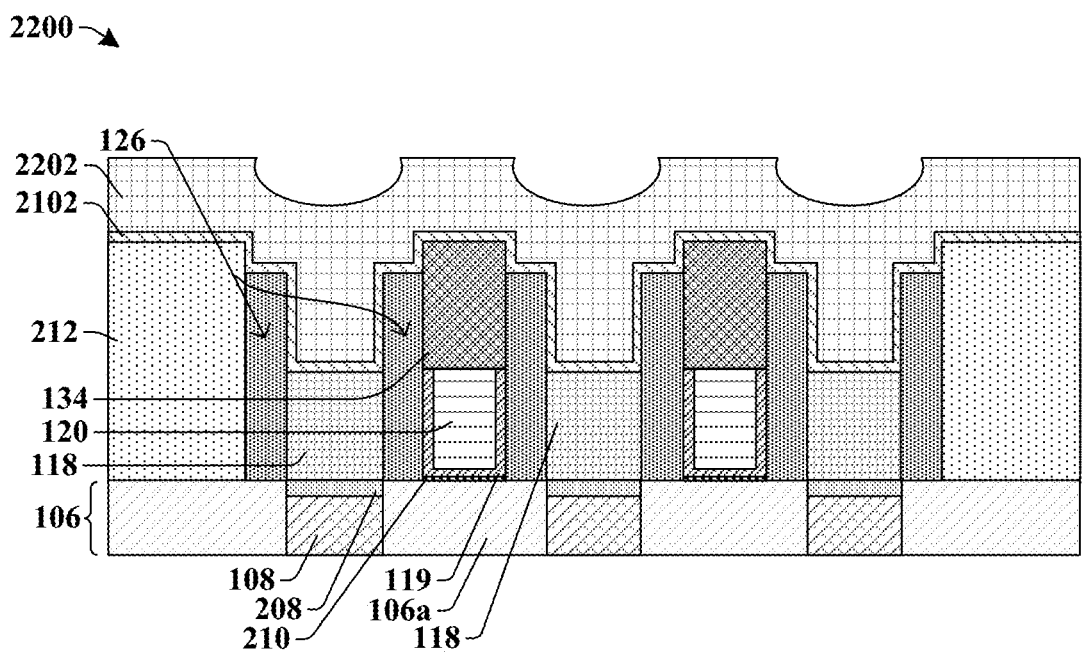

As illustrated in cross-sectional view 2200 of FIG. 22, in some embodiments, a liner hard mask material 2202 is formed over the continuous liner layer 2102. The liner hard mask material 2202 may, in some embodiments, completely cover the continuous liner layer 2102. In some embodiments, the liner hard mask material 2202 may be deposited by way of a deposition process (e.g., CVD, PVD, PE-CVD, ALD, etc.).

Figure 23:
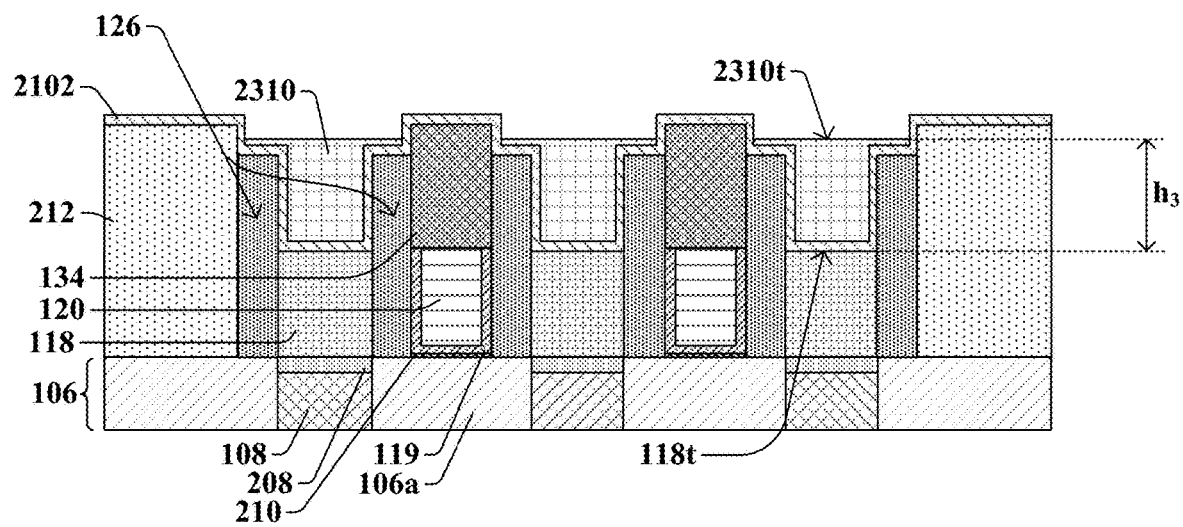

As illustrated in cross-sectional view 2300 of FIG. 23, a liner hard mask etchback may be performed to remove portions of the liner hard mask material (2202 of FIG. 22) to form a liner hard mask structure 2310 over the contact layer 118. The liner hard mask etchback may be performed such that the liner hard mask structure 2310 has a topmost surface 2310t at a third height $h_3$ measured in the vertical direction from the topmost surface 118t of the contact layer 118. In some embodiments, the liner hard mask etchback may be conducted using a removal (e.g., etching) process that selectively removes the liner hard mask material (2202 of FIG. 22), while the continuous liner layer 2102 may remain substantially unchanged.

Figure 24:
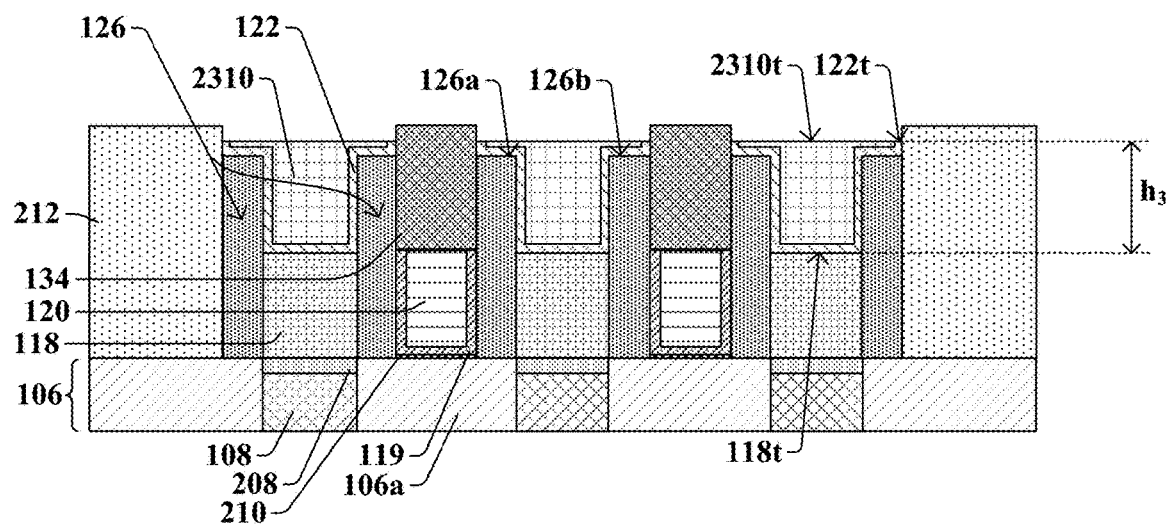

As shown in cross-sectional view 2400 of FIG. 24, a liner etchback may be performed to remove portions of the continuous liner layer (2102 of FIG. 23) that are above the topmost surface 2310t of the liner hard mask structure 2310 to form a liner layer 122 arranged between the liner hard mask structure 2310 and the contact layer 118. After the liner etchback, the liner layer 122 may have a topmost surface 122t that is also at the third height $h_3$ as measured from the topmost surface 118t of the contact layer 118 in the vertical direction. In some embodiments, the liner etchback may be conducted using a removal (e.g., etching) process that selectively removes the continuous liner layer (2102 of FIG. 23), while the first dielectric layer 212 and/or gate isolation structure 134 remain substantially unchanged.

In some embodiments, the third height $h_3$ is below the first and second topmost surfaces 126a, 126b of the spacer structure 126. In such embodiments, the spacer structure 126 may become damaged (e.g., spacer loss or defects by ion bombardment) from the liner etchback as the liner etchback removes the continuous liner layer (2102 of FIG. 23) from the first and second topmost surfaces 126a, 126b of the spacer structure 126.

Figure 25:
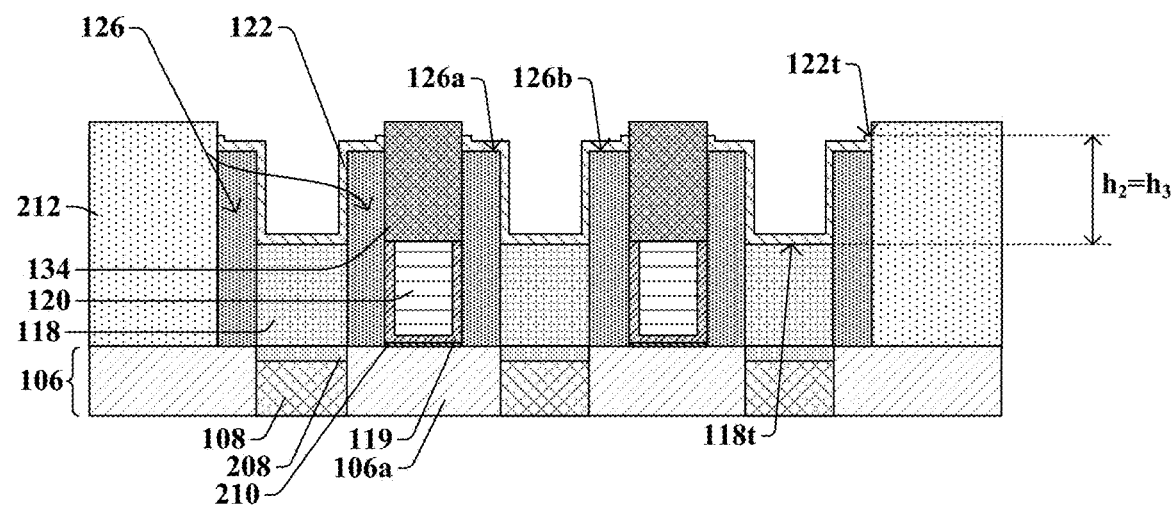

As shown in cross-sectional view 2500 of FIG. 25, the liner hard mask structure (2310 of FIG. 24) may be removed. In some embodiments, the liner hard mask structure (2310 of FIG. 24) is removed by a wet etchant.

In some embodiments, the liner hard mask structure (2310 of FIG. 24) may be used to control the design of the liner layer 122. For example, in some embodiments, the liner layer 122 may have a topmost surface 122t that is above the first and second topmost surfaces 126a, 126b of the spacer structure 126, as illustrated in FIG. 25. The topmost surface 122t of the liner layer 122 may be at a second height $h_2$ measured from the topmost surface 118t of the contact layer 118. In some embodiments, the second height $h_2$ of the liner layer 122 equals the third height $h_3$ of the liner hard mask structure (2310 of FIG. 24). In such embodiments, the liner layer 122 completely covers the first and second topmost surfaces 126a, 126b of the spacer structure 126. In other embodiments, the liner layer 122 (and the liner hard mask structure 2310 of FIG. 24) may have a topmost surface 122t that is about even with or below the first and second topmost surfaces 126a, 126b of the spacer structure 126. In such embodiments, the liner layer 122 may not cover the first and second topmost surfaces 126a, 126b of the spacer structure 126. Although reducing the height of the liner layer 122 may reduce the capacitance of the overall device, the liner layer 122 may be less protective of the spacer structure 126 when the liner layer 122 does not cover the first and second topmost surfaces 126a, 126b of the spacer structure 126.

In yet other embodiments, the steps in FIGS. 22-25 are skipped, and the topmost surface 122t of the liner layer 122 is still arranged over the first dielectric layer 212 as illustrated in the cross-sectional view 2100 of FIG. 21. In such embodiments, manufacturing time may be reduced but capacitance in the final device due to excess liner layer 122 may be at increased risk.

Figure 26:
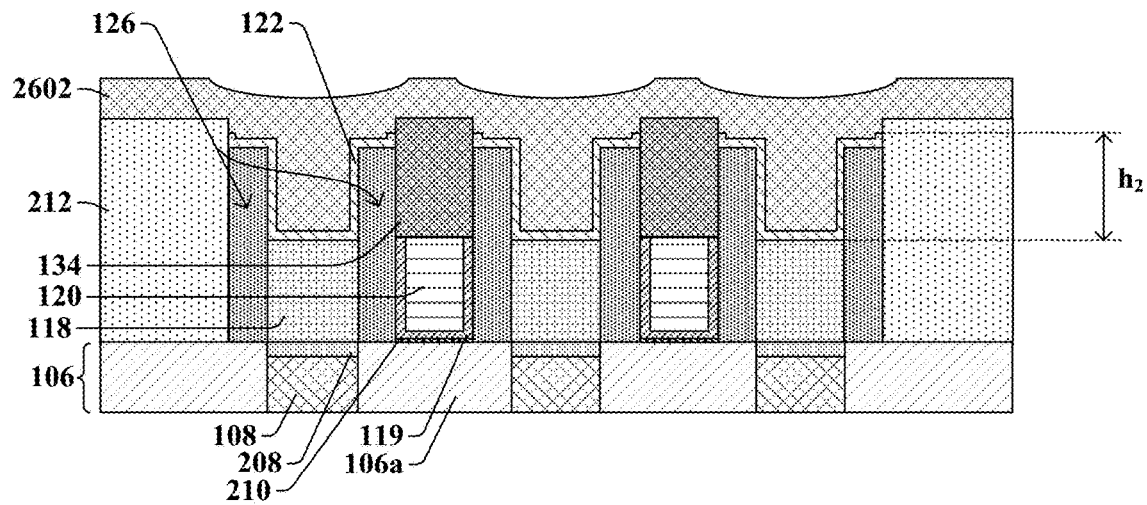

As shown in cross-sectional view 2600 of FIG. 26, in some embodiments, a via hard mask material 2602 is arranged over the liner layer 122 and the first dielectric layer 212. In some embodiments, the via hard mask material 2602 comprises a different material than the liner layer 122. In some embodiments, the via hard mask material 2602 comprises, for example, a low-k dielectric material such as silicon oxide, silicon oxygen carbide, tantalum carbon nitride, silicon nitride, silicon oxygen carbon nitride, silicon, zirconium nitride, or silicon carbon nitride. In other embodiments, a first portion of the via hard mask material 2602 that is arranged directly between the spacer structure 126 is a different material than a second portion of the via hard mask material 2602 that is formed over the spacer structure 126. The via hard mask material 2602 may be deposited by way of a deposition process (e.g., CVD, PVD, PE-CVD, ALD, etc.).

Figure 27:
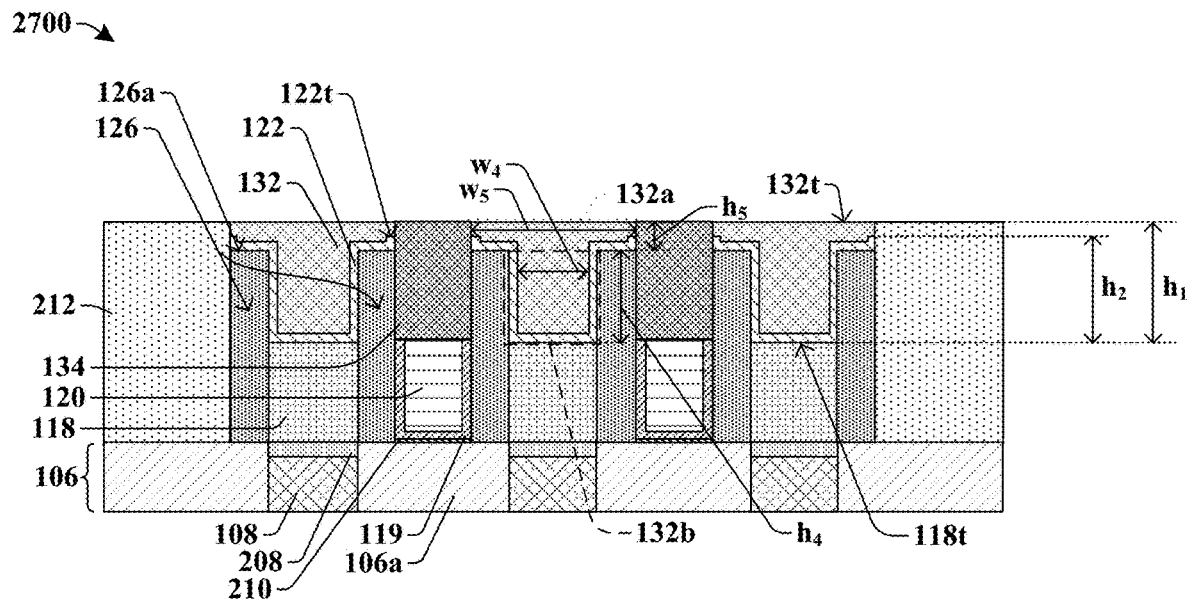

As shown in cross-sectional view 2700 of FIG. 27, in some embodiments, a planarization process (e.g., CMP) is performed to remove portions of the via hard mask material (2602 of FIG. 26) arranged over the first dielectric layer 212 and the gate isolation structure 134 to form a hard mask structure 132. After the planarization process, in some embodiments, the first dielectric layer 212, the hard mask structure 132, and the gate isolation structure 134 may have substantially co-planar upper surfaces. Further, in other embodiments where the steps in FIGS. 22-25 are skipped, the planarization process may also remove portions of the continuous liner layer (2102 of FIG. 21) that are arranged over the first dielectric layer 212 and the gate isolation structure 134. In such embodiments, after the planarization process, the topmost surface 122t of the liner layer 122 may also be substantially co-planar with an upper surface of the hard mask structure 132.

In some embodiments, the hard mask structure 132 has a topmost surface 132t at a first height $h_1$ measured in the vertical direction from the topmost surface 118t of the contact layer 118. In some embodiments a ratio between the second height $h_2$ of the liner layer 122 to the first height $h_1$ of the hard mask structure 132 may be in a range of between, for example, approximately 10 percent and approximately 100 percent.

Further, in some embodiments, the hard mask structure 132 comprises an upper portion 132a and a lower portion 132b. In some embodiments, the upper and lower portions 132a, 132b of the hard mask structure 132 comprise a same material. In other embodiments, the upper and lower portions 132a, 132b comprise different materials. The lower portion 132b of the hard mask structure 132 may be arranged directly between the spacer structure 126. In some embodiments, the lower portion 132b of the hard mask structure 132 has a fourth width $w_4$ measured in the lateral direction between outermost sidewalls of the lower portion 132b of the hard mask structure 132. In some embodiments, the fourth width $w_4$ is in a range of between approximately 5 nanometers and approximately 30 nanometers. The lower portion 132b may have a fourth height $h_4$ measured in the vertical direction from the topmost surface 118t of the contact layer 118 to the first topmost surface 126a of the spacer structure 126. In some embodiments, the fourth height $h_4$ may be in a range of between approximately 1 nanometer and approximately 50 nanometers. In some embodiments, the upper portion 132a of the hard mask structure 132 has a fifth width $w_5$ measured in the lateral direction between outermost sidewalls of the upper portion 132a of the hard mask structure 132. In some embodiments, the fifth width $w_5$ is in a range of between approximately 5 nanometers and approximately 30 nanometers. The upper portion 132a may have a fifth height $h_5$ measured in the vertical direction from the first topmost surface 126a of the spacer structure 126 to the topmost surface 132t of the hard mask structure 132. In some embodiments, the fifth height $h_5$ may be in a range of between approximately 1 nanometer and approximately 50 nanometers.

Figure 28:
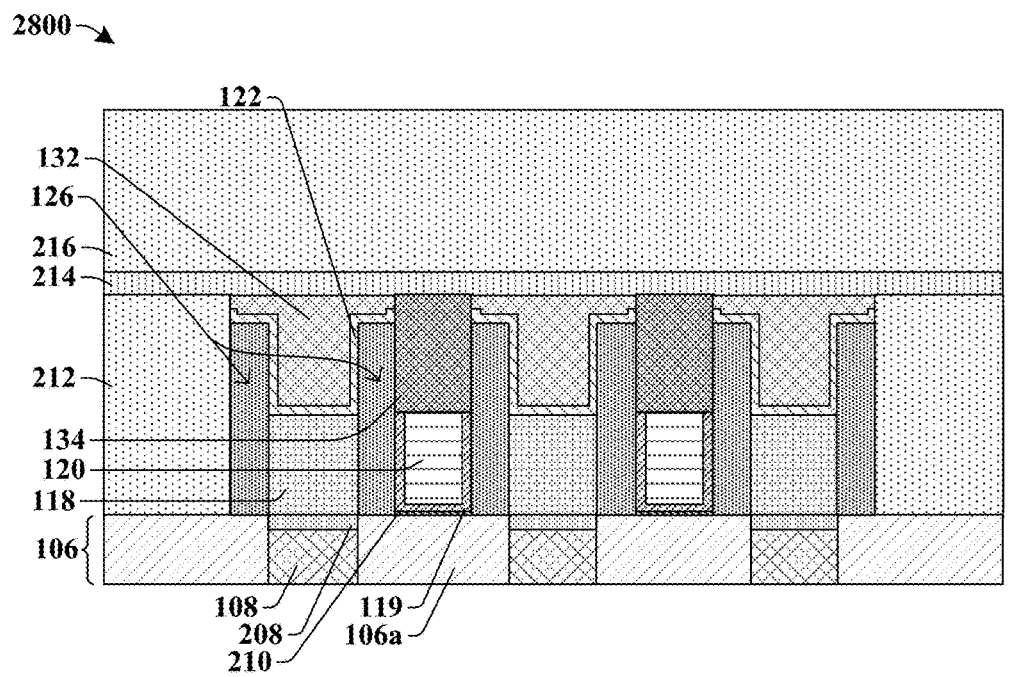

As shown in cross-sectional view 2800 of FIG. 28, in some embodiments, an etch stop layer 214 is deposited over the first dielectric layer 212, the hard mask structure 132, and the gate isolation structure 134, and a second dielectric layer 216 is deposited over the etch stop layer 214. In some embodiments, the etch stop layer 214 may comprise, for example, silicon oxide, hafnium silicon, silicon oxygen carbide, aluminum oxygen, zirconium silicon, aluminum oxygen nitride, zirconium oxide, tantalum oxide, lanthanum oxide, yttrium oxide, tantalum carbon nitride, silicon nitride, silicon oxygen carbon nitride, silicon, zirconium nitride, silicon carbon nitride, or the like. In some embodiments, the etch stop layer 214 may have a thickness measured in the vertical direction in a range of between approximately 1 nanometer and approximately 30 nanometers. Further, in some embodiments, the second dielectric layer 216 may each comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. The etch stop layer 214 and the second dielectric layer 216 may each be deposited by way of a deposition process (e.g., CVD, PVD, PE-CVD, ALD, etc.).

Figure 29A:
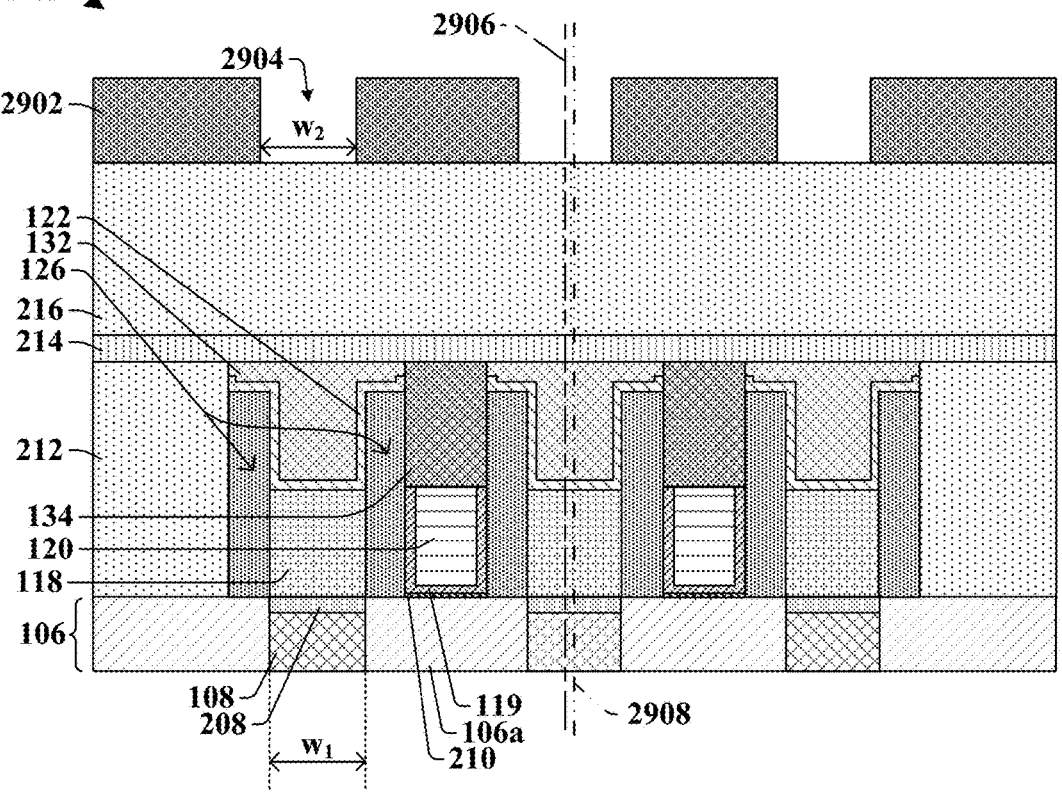

As shown in cross-sectional view 2900A of FIG. 29A, a second masking structure 2902 may be formed over the second dielectric layer 216. The second masking structure 2902 may comprise a first opening 2904 arranged over the contact layer 118. The second masking structure 2902 may be formed by way of photolithography and removal (e.g., etching) processes. In some embodiments, the contact layer 118 may have a first width $w_1$ measured in a lateral direction, and the first opening 2904 may have a second width $w_2$ measured in the lateral direction. In some embodiments, the first width $w_1$ may equal the second width $w_2$. However, in some embodiments, the first opening 2904 may not "land centered" over the contact layer 118 and thus, the first opening 2904 may directly overlie the spacer structure 126. For example, in some embodiments during the formation of the second masking structure 2902, a first center line 2906 which is arranged at the center of the first opening 2904 and runs in the vertical direction may not be collinear with a second center line 2908 which is arranged at the center of the contact layer 118 and runs in the vertical direction. In other embodiments, the second masking structure 2902 and the first opening 2904 may "land centered" over the contact layer 118, and thus, the first and second center lines 2906, 2908 would be collinear. In yet other embodiments, the second width $w_2$ may be greater than the first width $w_1$, and thus, even if the first and second center lines 2906, 2908 were collinear, the first opening 2904 would still directly overlie the spacer structure 126. In some embodiments, the second width $w_2$ is in a range of between, for example, approximately 1 nanometer and approximately 50 nanometers.

Figure 29B:
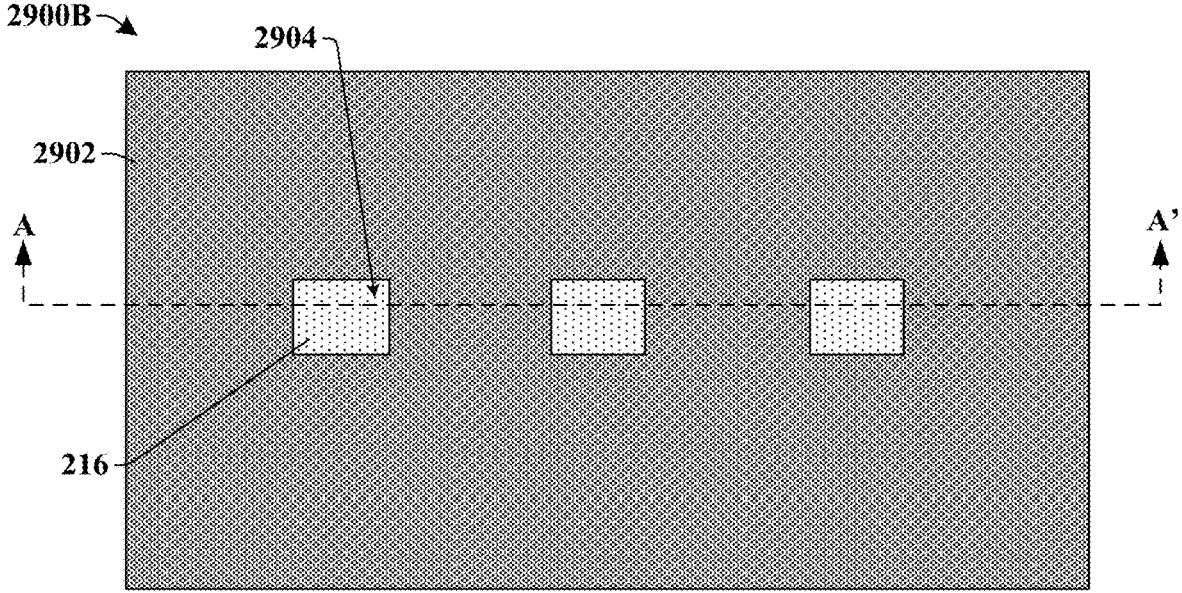

Top-view 2900B of FIG. 29B may correspond to the cross-sectional view 2900A of FIG. 29A, in some embodiments. Cross-section line AA' of FIG. 29B may correspond to some embodiments of the cross-sectional view 2900A of FIG. 29A. In some embodiments, from the top-view 2900B, the first opening 2904 in the second masking structure 2902 may resemble a polygon-like shape such as, for example, a square or rectangle. In other embodiments, from the top-view 2900B, the first opening 2904 may resemble other shapes such as a circle or an oval, for example.

Figure 30A:
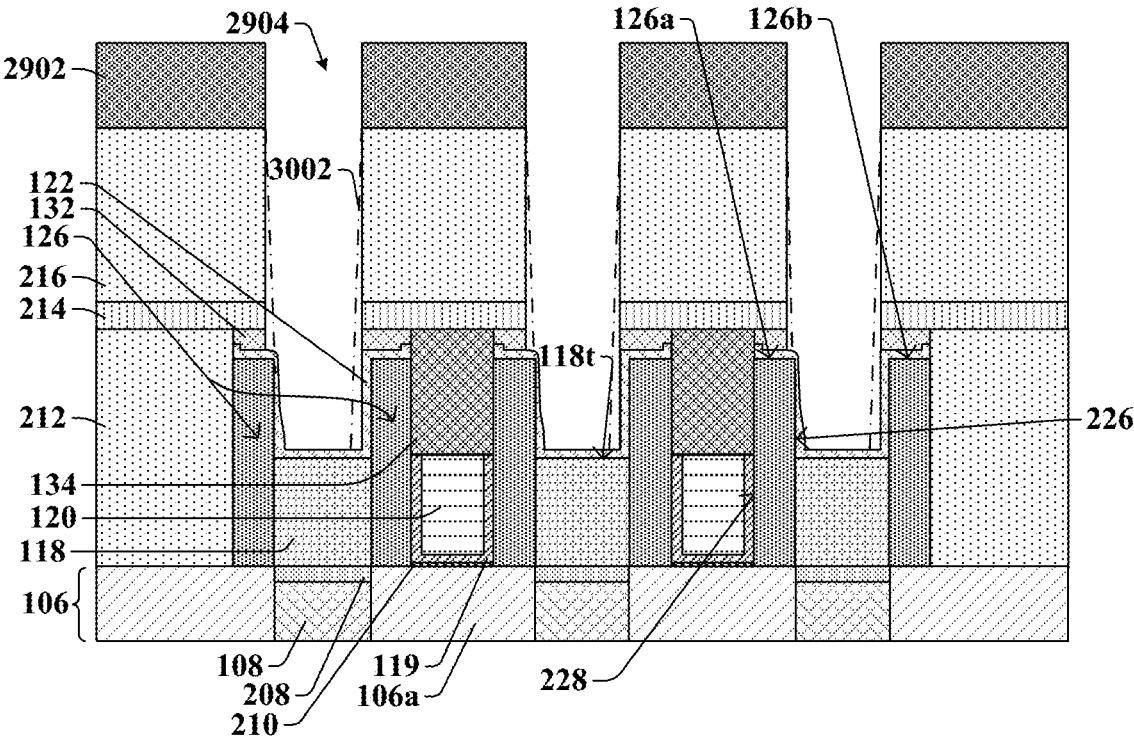
Figure 30B:
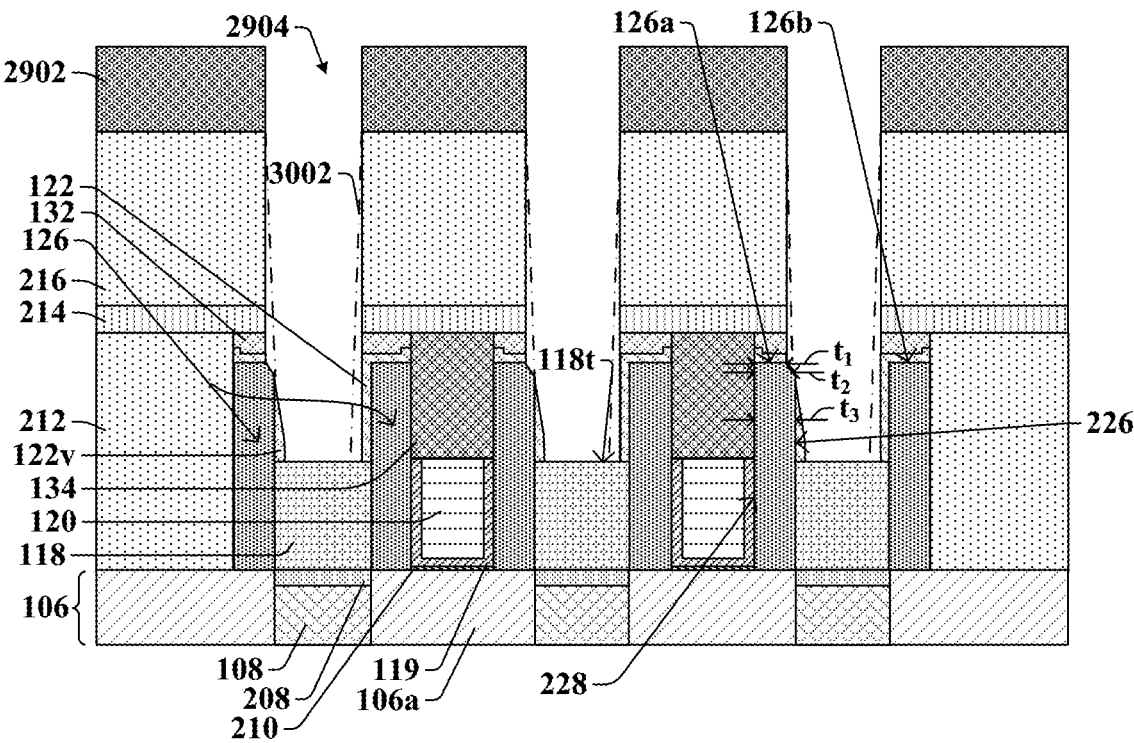

As shown in cross-sectional view 3000A of FIG. 30A and in cross-sectional view 3000B of FIG. 30B, in some embodiments, a first etching process may be conducted according to the first opening 2904 in the second masking structure 2902 to remove portions of the second dielectric layer 216, the etch stop layer 214, and the hard mask structure 132 that directly underlie the first opening 2904. In some embodiments, the first etching process may comprise multiple etchants, whereas in other embodiments, one etchant may sufficiently remove each material of the second dielectric layer 216, the etch stop layer 214, and the hard mask structure 132. In some embodiments, the inner sidewalls of the second dielectric layer 216, the etch stop layer 214, and the hard mask structure 132 after the first etching process may be along the vertical direction, whereas in other embodiments, the inner sidewalls of the second dielectric layer 216, the etch stop layer 214, and the hard mask structure 132 after the first etching process may be slanted (e.g., not along the vertical direction), as illustrated by exemplary lines 3002, for example.

A first etchant of the first etching process may be used to remove the hard mask structure 132, as illustrated in the cross-sectional view 3000A of FIG. 30A. The hard mask structure 132 comprises a first material that has a first removal rate (e.g., amount of first material removed per time) when exposed to the first etchant. The liner layer 122 comprises a second material that has a second removal rate (e.g., amount of second material removed per time) when exposed to the first etchant. The spacer structure 126 comprises a third material that has a third removal rate (e.g., amount of third material removed per time) when exposed to the first etchant. The second material of the liner layer 122 is different than the first material of the hard mask structure 132 and different than the third material of the spacer structure 126. Further, the second removal rate of the liner layer 122 is less than the first removal rate of the hard mask structure 132 and less than the third removal rate of the spacer structure 126. Thus, in embodiments where the liner layer 122 is arranged between the hard mask structure 132 and the spacer structure 126, during the first etching process, the liner layer 122 delays the exposure of the spacer structure 126 to the first etchant. For example, in some embodiments, after the hard mask structure 132 that directly underlies the first opening 2904 is completely removed, the liner layer 122 may still be covering the spacer structure 126 and the contact layer 118, as illustrated in the cross-sectional view 3000A of FIG. 30A. In some embodiments, some of the liner layer 122 exposed to the first etchant may be removed such that the exposed liner layer 122 is thinned.

In some embodiments, the first etching process is conducted until the first etchant removes portions of the liner layer 122 from the contact layer 118 such that the topmost surface 118t of the contact layer 118 is exposed, as illustrated in the cross-sectional view 3000B of FIG. 30B. However, in doing so, portions of the liner layer 122 that cover the spacer structure 126 may be removed too, thereby exposing the spacer structure 126 to the first etchant. In other embodiments, a second etchant is used to remove portions of the liner layer 122 from the contact layer, as illustrated in the cross-sectional view 3000B of FIG. 30B. In such embodiments, the second etchant may remove the liner layer 122 more quickly than the first etchant. Thus, removal of the liner layer 122 by the second etchant after the first etchant may reduce the time to expose the contact layer 118 than if only the first etchant is used for the first etching process.

Thus, in some embodiments, the cross-sectional view 3000A of FIG. 30A illustrates the first etching process after a first time of using the first etchant, and the cross-sectional view 3000B of FIG. 30B illustrates the first etching process after a second time of using the first etchant. In other embodiments, the cross-sectional view 3000A of FIG. 30A illustrates the first etching process after using the first etchant, and the cross-sectional view 3000B of FIG. 30B illustrates the first etching process after using the second etchant.

In some embodiments, the first and/or second etchant is a vertical dry etchant (e.g., plasma gas). Thus, exposed horizontal portions of the liner layer 122 on the first and/or second topmost surfaces 126a, 126b of the spacer structure 126 may be removed more quickly than exposed vertical portions of the liner layer 122 on a first inner sidewall 226. In other embodiments, wherein the topmost surface 122t of the liner layer 122 is arranged below the first and second topmost surfaces 126a, 126b of the spacer structure, horizontal portions are not present on the first and second topmost surfaces 126a, 126b of the spacer structure 126. In such other embodiments, the spacer structure 126 may not be as protected from the first and/or second etchant compared to embodiments where the liner layer 122 covers the first and second topmost surfaces 126a, 126b of the spacer structure 126.

In some embodiments, when the first etching process completely removes a portion of the liner layer 122 from the spacer structure 126, an exposed portion of the spacer structure 126 may be removed by the first etching process. Thus, in some embodiments, although the first and second topmost surfaces 126a, 126b of the spacer structure 126 may be covered by the liner layer 122, portions of the spacer structure 126 may still be removed by the first etching process. However, because the liner layer 122 reduces the amount of time that the spacer structure 126 is exposed to the first etching process, the amount of the spacer structure 126 loss by the first etching process is reduced. Further, in some embodiments, a vertical portion 122v of the liner layer 122 may still be present over the contact layer 118 after the first etching process even though the vertical portion 122v directly underlies the first opening 2904 of the second masking structure 2902, as illustrated in the cross-sectional view 3000B of FIG. 30B.

In some embodiments, after the first etching process, as illustrated in FIG. 30B, the first topmost surface 126a of the spacer structure 126 may have a first thickness $t_1$, the spacer structure 126 may have a second thickness $t_2$ that is greater than the first thickness $t_1$ at a first location below the first topmost surface 126a of the spacer structure 126, and the spacer structure 126 may have a third thickness $t_3$ that is greater than the second thickness $t_2$. The third thickness $t_3$ may be measured at a second location that is above the topmost surface 118t of the contact layer 118 and below the second location. In some embodiments, the third thickness $t_3$ may be a maximum thickness of the spacer structure 126. The first through third thicknesses $t_{1-3}$ may each be measured from the first inner sidewall 226 to the first outer sidewall 228 in the lateral direction.

In other embodiments, wherein the first width ($w_1$ of FIG. 29) is greater than or equal to the second width ($w_2$ of FIG. 29) and the first opening 2904 does not directly overlie the spacer structure 126, the first through third thicknesses $t_1$-$t_3$ may be about equal to one another because the spacer structure 126 may not be exposed to the first etching process.

Figure 31:
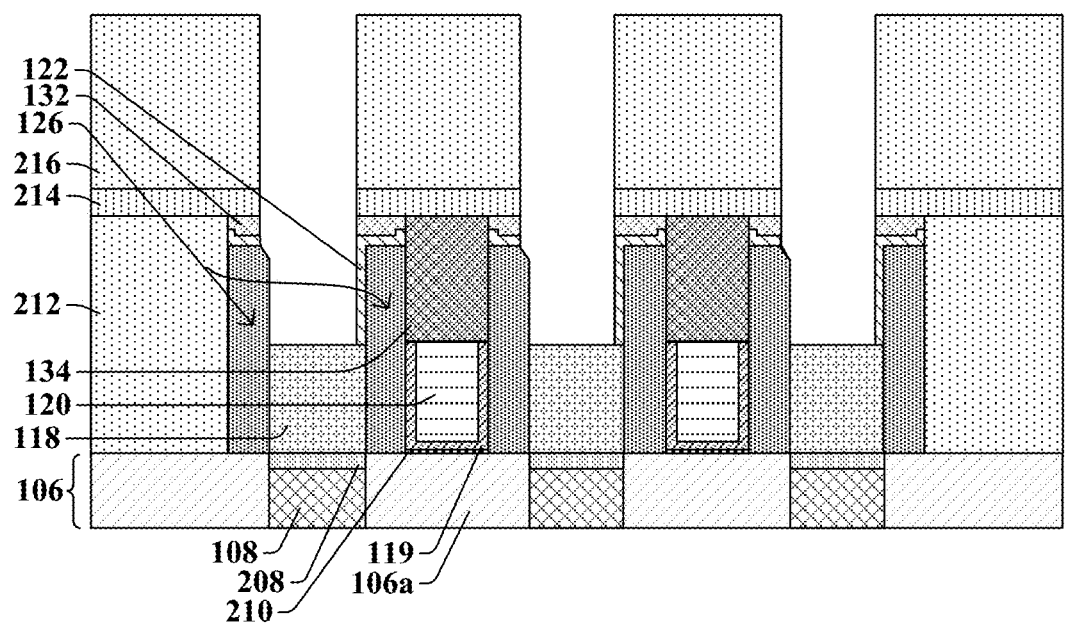

In some embodiments, the method proceeds from FIG. 30B to FIG. 31 to remove the vertical portion 122v of the liner layer 122. In other embodiments, the vertical portion 122v may remain in the final design, and thus, the method may proceed from FIG. 30B to FIG. 32, thereby skipping the step(s) in FIG. 31.

As illustrated in cross-sectional view 3100 of FIG. 31, in some embodiments, a second etching process is performed to remove the vertical portion (122v of FIG. 30B) of the liner layer 122. In some embodiments, the second etching process is a continuation of the first etching process and utilizes the first and/or second etchant. In other embodiments, the second etching process may comprise a third etchant different than the first and/or second etchants to selectively remove the vertical portion (122v of FIG. 30B) of the liner layer 122. Advantages of removing the vertical portion (122v of FIG. 30B) of the liner layer 122 include increasing the exposed surface area of the topmost surface 118t of the contact layer 118 to decrease the contact resistance between the contact layer 118 and an overlying contact via (124 of FIG. 33A) and/or to reduce capacitance of the final device. However, by removing the vertical portion (122v of FIG. 30B) of the liner layer 122, more of the spacer structure 126 may be removed, the spacer structure 126 may become damaged from the second etching process, the contact layer 118 may become damaged from the second etching process, and/or manufacturing time and cost are increased. Thus, in some other embodiments, the second etching process in FIG. 31 may be omitted from the method.

Figure 32:
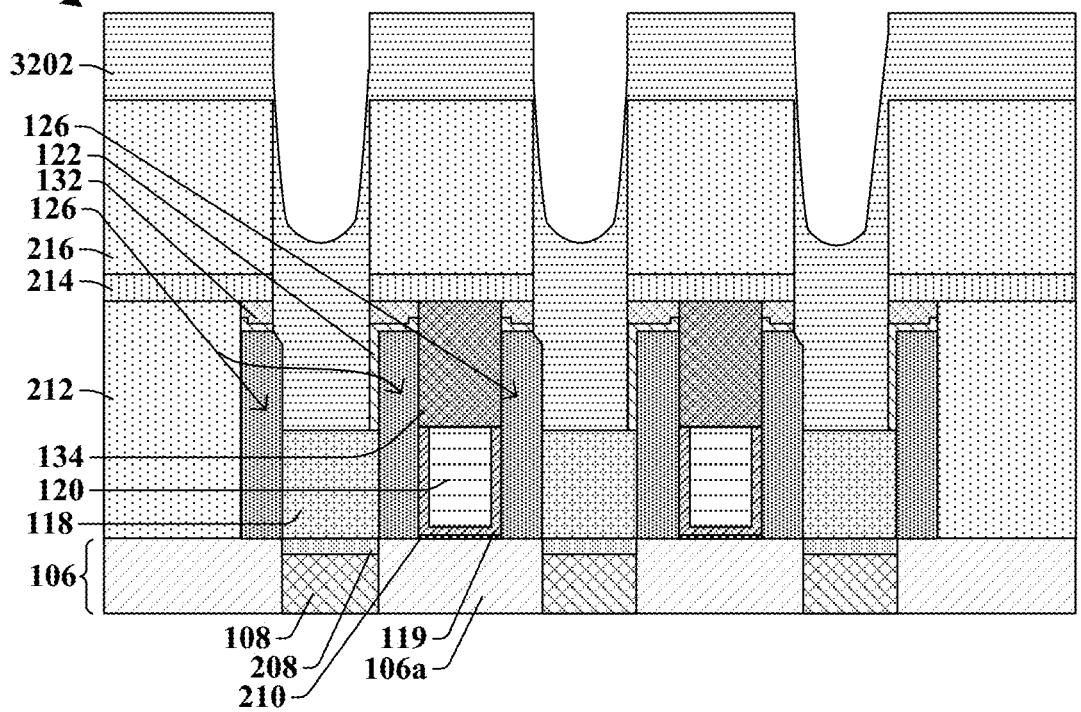

As illustrated in cross-sectional view 3200 of FIG. 32, in some embodiments, a conductive via material 3202 may be formed over the second dielectric layer 216 and over the contact layer 118. In some embodiments, before forming the conductive via material 3202, the second masking structure (2902 of FIG. 31) may be removed. In other embodiments, the second masking structure (2902 of FIG. 31) may remain present during the forming of the conductive via material 3202. In some embodiments, the conductive via material 3202 may comprise, for example, tungsten, ruthenium, cobalt, copper, titanium, titanium nitride, tantalum, tantalum nitride, molybdenum, nickel, or a combination thereof. In some embodiments, the conductive via material 3202 may be deposited by way of a deposition process (e.g., physical vapor deposition (PVD), chemical vapor deposition (CVD), PE-CVD, atomic layer deposition (ALD), sputtering, etc.).

Figure 33:
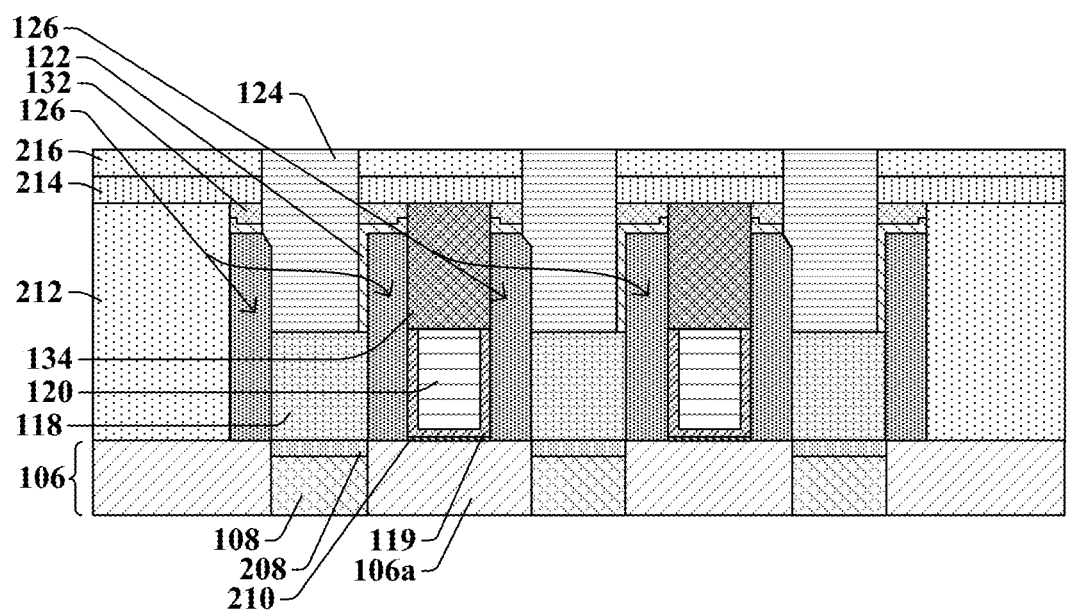

As illustrated in cross-sectional view 3300 of FIG. 33, a planarization process (e.g., CMP) may be performed to remove portions of the conductive via material (3202 of FIG. 32) arranged over the second dielectric layer 216 to form a contact via 124 directly contacting the contact layer 118. Further, in some embodiments, the planarization process (e.g., CMP) may remove portions of the second dielectric layer 216. In other embodiments, the planarization process (e.g., CMP) may completely remove the second dielectric layer 216, thereby exposing the etch stop layer 214. In some embodiments, after the planarization process (e.g., CMP), upper surfaces of the contact via 124 and the second dielectric layer 216 are substantially co-planar. Although the contact via 124 may not "land centered" over the contact layer 118, the spacer structure 126 still sufficiently provides isolation between the contact layer 118, the contact via 124, and the gate electrode 120 because of the liner layer 122, thereby increasing reliability of the final device.

It will be appreciated that in some embodiments, the method illustrated in FIGS. 12-33 may be adjusted to form a gate contact via (224 of FIG. 2B) over the gate electrode 120 using a liner layer 122 to form the structure illustrated in FIG. 2B, for example. In such embodiments, the liner layer 122 may still reduce the amount of loss from the spacer structure 126 such that the spacer structure 126 effectively isolates the contact via 124, the gate electrode 120, the contact layer 118, and/or the gate contact via (224 of FIG. 2B) from one another.

Figure 34:
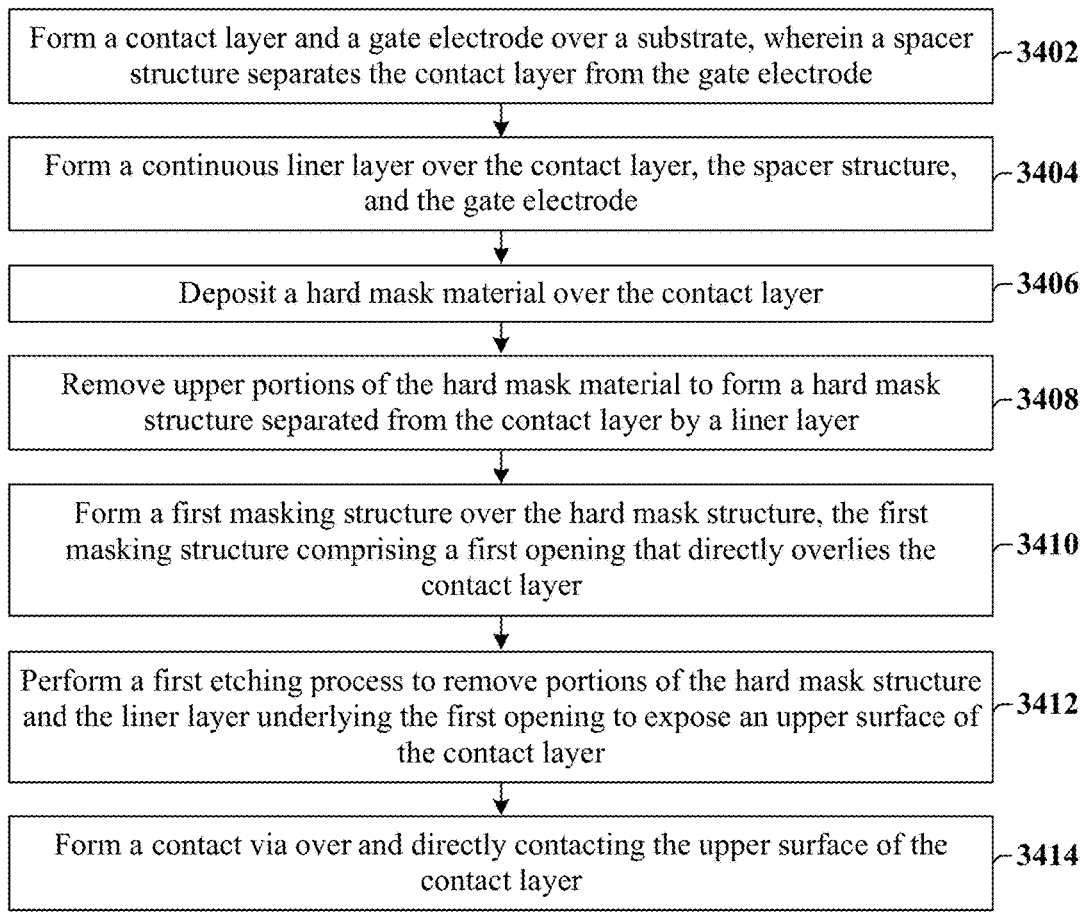
FIG. 34 illustrates a flow diagram of some embodiments of a method corresponding to FIGS. 12-33.

FIG. 34 illustrates a flow diagram of some embodiments of a method 3400 of forming an integrated chip having a liner layer arranged between a spacer structure and a hard mask structure.

While method 3400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 3402, a contact layer and a gate electrode are formed over a substrate. A spacer structure separates the contact layer from the gate electrode. FIGS. 12-20A illustrate cross-sectional views 1200-2000A, respectively, of some embodiments corresponding to act 3402.

At act 3404, a continuous liner layer is formed over the contact layer, the spacer structure, and the gate electrode. FIG. 21 illustrates cross-sectional view 2100 of some embodiments corresponding to act 3404.

At act 3406, a hard mask material is deposited over the contact layer. FIG. 26 illustrates cross-sectional view 2600 of some embodiments corresponding to act 3406.

At act 3408, upper portions of the hard mask material are removed to form a hard mask structure separated from the contact layer by a liner layer. FIG. 27 illustrates cross-sectional view 2700 of some embodiments corresponding to act 3408.

At act 3410, a first masking structure is formed over the hard mask structure. The first masking structure comprises a first opening that directly overlies the contact layer. FIG. 29A illustrates cross-sectional view 2900A of some embodiments corresponding to act 3410.

At act 3412, a first etching process is performed to remove portions of the hard mask structure and the liner layer underlying the first opening to expose an upper surface of the second contact layer. FIG. 30B illustrates cross-sectional view 3000B of some embodiments corresponding to act 3412.

At act 3414, a contact via is formed over and directly contacts the upper surface of the contact layer. FIGS. 32 and 33 illustrate cross-sectional views 3200 and 3300, respectively, of some embodiments corresponding to act 3414.

Therefore, the present disclosure relates to a method of forming a contact via over a contact layer surrounded by a spacer structure, wherein a liner layer mitigates loss of the spacer structure during the contact via formation.

Accordingly, in some embodiments, the present disclosure relates to an integrated chip comprising: a substrate; a first contact layer overlying the substrate; a gate electrode overlying the substrate and laterally spaced from the first contact layer; a first spacer structure surrounding outermost sidewalls of the first contact layer and separating the gate electrode from the first contact layer; a first hard mask structure arranged over the first contact layer and between portions of the first spacer structure; a first contact via extending through the first hard mask structure and contacting the first contact layer; and a first liner layer arranged directly between the first hard mask structure and the first spacer structure.

In other embodiments, the present disclosure relates to an integrated chip comprising: a substrate; a contact layer overlying the substrate; a gate electrode overlying the substrate and laterally spaced from the contact layer; a spacer structure surrounding outermost sidewalls of the contact layer and separating the gate electrode from the contact layer; a hard mask structure arranged over the contact layer and between portions of the spacer structure; a contact via extending through the hard mask structure and contacting the contact layer; and a liner layer arranged directly between the hard mask structure and the contact layer.

In yet other embodiments, the present disclosure relates to a method for forming an integrated chip comprising: forming a contact layer and a gate electrode over a substrate, wherein a spacer structure separates the contact layer from the gate electrode; forming a continuous liner layer over the contact layer, the spacer structure, and the gate electrode; depositing a hard mask material over the contact layer; removing upper portions of the hard mask material to form a hard mask structure separated from the contact layer by a liner layer; forming a first masking structure over the hard mask structure, the first masking structure comprising a first opening that directly overlies the contact layer; performing a first removal process to remove portions of the hard mask structure and the liner layer underlying the first opening to expose an upper surface of the contact layer; and forming a contact via over and directly contacting the upper surface of the contact layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
   a substrate;
   a source/drain region arranged along the substrate;
   a first contact layer comprising a metal overlying the substrate;
   a gate electrode overlying the substrate and laterally spaced from the first contact layer;
   a first spacer structure surrounding outermost sidewalls of the first contact layer and separating the gate electrode from the first contact layer;
   a first hard mask structure comprising a dielectric arranged directly over the first contact layer and between portions of the first spacer structure;
   a first contact via extending through the first hard mask structure and contacting the first contact layer; and
   a first liner layer arranged directly between a sidewall of the first hard mask structure and a sidewall of the first spacer structure.

2. The integrated chip of claim 1, wherein the first liner layer separates the first hard mask structure from the first contact layer.

3. The integrated chip of claim 1, wherein the first spacer structure has a first thickness measured in a lateral direction from a first inner sidewall to a first outer sidewall that is a minimum thickness of the first spacer structure, wherein the first spacer structure has a second thickness, different from the first thickness, measured in the lateral direction from the first inner sidewall to the first outer sidewall measured in the lateral direction that is a maximum thickness of the first spacer structure, and wherein the first thickness and the second thickness are measured at heights that are above a top surface of the first contact layer.

4. The integrated chip of claim 1, wherein the first liner layer is arranged directly between the first contact layer and the first contact via.

5. The integrated chip of claim 1, wherein the first liner layer is arranged over first and second topmost surfaces of the first spacer structure.

6. The integrated chip of claim 1, further comprising:
   a second contact layer overlying the substrate, wherein the gate electrode is between the first and second contact layers;
   a second spacer structure surrounding outermost sidewalls of the second contact layer and separating the gate electrode from the second contact layer;
   a second hard mask structure arranged over the second contact layer and between the second spacer structure;
   a second contact via extending through the second hard mask structure and contacting the second contact layer; and
   a second liner layer arranged directly between the second hard mask structure and the second spacer structure.

7. The integrated chip of claim 6, wherein the first liner layer and the second liner layer do not contact one another.

8. An integrated chip comprising:
   a substrate;
   a source/drain region arranged along the substrate;

a contact layer comprising a metal overlying the substrate;

a gate electrode overlying the substrate and laterally spaced from the contact layer;

a spacer structure surrounding outermost sidewalls of the contact layer and separating the gate electrode from the contact layer;

a hard mask structure arranged directly over the contact layer and directly between portions of the spacer structure;

a contact via extending through the hard mask structure and contacting the contact layer; and a liner layer comprising a dielectric arranged directly between the hard mask structure and the contact layer.

9. The integrated chip of claim 8, wherein the liner layer comprises a different material than the hard mask structure and the spacer structure.

10. The integrated chip of claim 8, wherein the liner layer directly contacts a topmost surface of the spacer structure.

11. The integrated chip of claim 8, wherein the liner layer has a topmost surface that is below a topmost surface of the spacer structure.

12. The integrated chip of claim 8,
wherein the hard mask structure has a topmost surface at a first height measured in a vertical direction from a topmost surface of the contact layer;
wherein the liner layer has a topmost surface a second height measured in the vertical direction from the topmost surface of the contact layer; and
wherein a ratio of the second height to the first height is between about 10 percent and about 100 percent.

13. The integrated chip of claim 8, the contact via does not directly overlie the liner layer.

14. An integrated chip comprising:
a substrate;
a source/drain region arranged along the substrate;
a contact layer comprising a metal arranged over the substrate;
a gate electrode arranged over the substrate and laterally beside the contact layer;
a spacer structure arranged over the substrate, directly between the contact layer and the gate electrode, and along outer sidewalls of the contact layer;
a liner layer comprising a dielectric arranged on inner sidewalls of the spacer structure and directly over a top surface of the contact layer;
a hard mask structure arranged over the liner layer, the spacer structure, and the contact layer; and
a contact via extending through the hard mask structure and the liner layer to contact the contact layer, wherein the liner layer comprises a different material than the hard mask structure and the spacer structure.

15. The integrated chip of claim 14, wherein an upper portion of the spacer structure has a thickness measured in the lateral direction that increases from a topmost surface of the spacer structure toward a bottommost surface of the spacer structure, and wherein the upper portion is arranged completely above a topmost surface of the gate electrode.

16. The integrated chip of claim 14, wherein the contact via directly contacts the spacer structure.

17. The integrated chip of claim 14, wherein the liner layer extends over upper surfaces of the spacer structure.

18. The integrated chip of claim 14, wherein a maximum thickness of the spacer structure that is measured in the lateral direction is arranged above the gate electrode.

19. The integrated chip of claim 14, wherein the liner layer comprises a dielectric material that has a higher dielectric constant than a material of the hard mask structure.

20. The integrated chip of claim 14, wherein the liner layer comprises a dielectric material that has a higher dielectric constant than a material of the spacer structure.

* * * * *